United States Patent
Kondo

(10) Patent No.: US 9,590,584 B2
(45) Date of Patent: Mar. 7, 2017

(54) RESONATION DEVICE, ELECTRONIC DEVICE, AND MOVING OBJECT

(71) Applicant: SEIKO EPSON CORPORATION, Tokyo (JP)

(72) Inventor: Manabu Kondo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 260 days.

(21) Appl. No.: 14/218,197

(22) Filed: Mar. 18, 2014

(65) Prior Publication Data

US 2014/0292151 A1 Oct. 2, 2014

(30) Foreign Application Priority Data

Mar. 27, 2013 (JP) ................. 2013-065772

(51) Int. Cl.
| | |
|---|---|
| *H03H 9/08* | (2006.01) |
| *H03H 9/02* | (2006.01) |
| *H03H 9/05* | (2006.01) |
| *H03H 9/10* | (2006.01) |

(52) U.S. Cl.
CPC ...... *H03H 9/02102* (2013.01); *H03H 9/0504* (2013.01); *H03H 9/0547* (2013.01); *H03H 9/1014* (2013.01); *H01L 2224/48091* (2013.01); *H01L 2224/48227* (2013.01); *H01L 2224/48465* (2013.01); *H01L 2224/49171* (2013.01)

(58) Field of Classification Search
CPC ........ H03H 9/08; H03H 3/04; H01L 41/0533; H01L 41/053

USPC .......................... 310/343, 344, 346
See application file for complete search history.

(56) References Cited

U.S. PATENT DOCUMENTS

| | | | | |
|---|---|---|---|---|
| 6,049,256 A | * | 4/2000 | Fry ...................... | H03H 9/0528 310/343 |
| 8,035,454 B2 | * | 10/2011 | Navet ..................... | H03L 1/028 310/343 |
| 8,569,936 B2 | * | 10/2013 | Park ....................... | H03H 9/177 310/344 |
| 2006/0290239 A1 | * | 12/2006 | Kasahara ............. | H03H 9/0514 310/346 |
| 2009/0023400 A1 | * | 1/2009 | Nishio .................... | H03B 1/02 455/91 |
| 2009/0230486 A1 | | 9/2009 | Shimodaira | |
| 2010/0066213 A1 | * | 3/2010 | Takahashi ................ | H03H 3/02 310/364 |

(Continued)

FOREIGN PATENT DOCUMENTS

| | | |
|---|---|---|
| EP | 2 228 903 B1 | 11/2011 |
| JP | A-2007-158455 | 6/2007 |

(Continued)

*Primary Examiner* — Shawki S Ismail
*Assistant Examiner* — Bryan Gordon
(74) *Attorney, Agent, or Firm* — Oliff PLC

(57) ABSTRACT

A resonation device includes a heat generation element as a heat generation portion which is disposed on a bottom plate of a package as a base substrate, a resonator element having connection portions and fixed to the heat generation element, and a protruding portion which overlaps a region different from the connection portions and of the resonator element when seen in plan view and is provided on the bottom plate. The area of the connection portions is larger than the area of the protruding portion when seen in plan view.

20 Claims, 11 Drawing Sheets

(56) References Cited

U.S. PATENT DOCUMENTS

2013/0162360 A1    6/2013   Nishio
2013/0221801 A1    8/2013   Shimodaira

FOREIGN PATENT DOCUMENTS

| JP | A-2009-27307 | 2/2009 |
| JP | A-2009-38823 | 2/2009 |
| JP | A-2009-225093 | 10/2009 |
| JP | A-2010-213280 | 9/2010 |
| JP | A-2010-220041 | 9/2010 |

\* cited by examiner

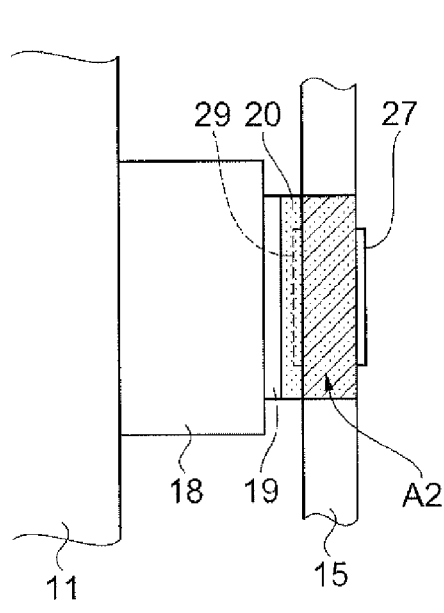
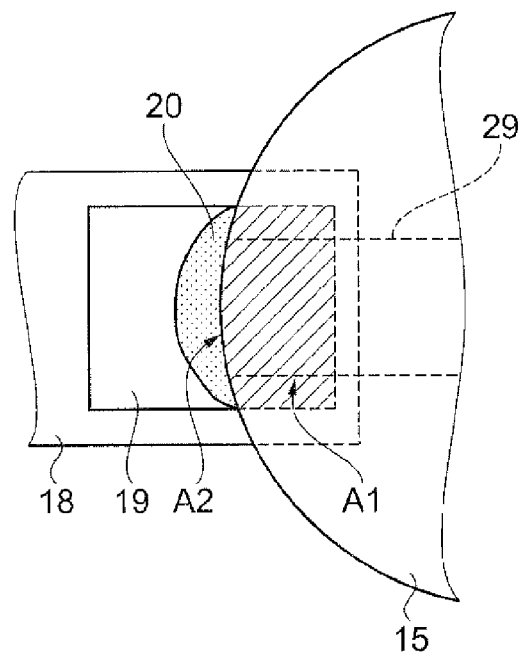
FIG. 2A  FIG. 2B
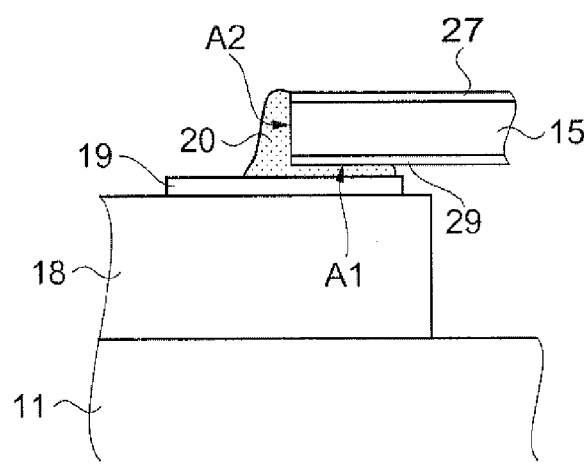
FIG. 2C

RESONATION DEVICE, ELECTRONIC DEVICE, AND MOVING OBJECT

BACKGROUND

1. Technical Field

The present invention relates to a resonation device including a resonator element heated by a heat generation portion, an electronic device using the resonation device, and a moving object.

2. Related Art

In the related art, resonation devices (resonators) have been known in which the temperature of a resonator element is stabilized by heating the resonator element, and a resonance frequency is stabilized. For example, in a resonation device (oscillator device) disclosed in JP-A-2010-213280, a configuration is proposed in which a piezoelectric resonance element (resonator element) which is one-sidedly connected onto an integrated circuit chip including a heating unit (heat generation portion) is sealed within a vacuum chamber (package storage space). In this manner, the piezoelectric resonance element (resonator element) is connected directly onto the integrated circuit chip including the heating unit (heat generation portion), thereby allowing the piezoelectric resonance element (resonator element) to be heated efficiently.

However, in the resonation device having the aforementioned configuration, since the piezoelectric resonance element (resonator element) is one-sidedly connected onto the integrated circuit chip including the heating unit (heat generation portion), the piezoelectric resonance element (resonator element) except for a connection portion becomes free, and thus the following problems occur. For example, when an impact from the outside is applied to the resonation device, portions other than the connection portion of the piezoelectric resonance element (resonator element) are bent due to the impact, and thus the connection of the connection portion is deteriorated or the piezoelectric resonance element (resonator element) is broken down. In addition, since one point support is used when the piezoelectric resonance element (resonator element) is placed on the integrated circuit chip and is connected thereto, portions other than the connection portion of the piezoelectric resonance element (resonator element) are, for example, brought into contact with the bottom face of a package, and thus it is difficult to stabilize the posture of the piezoelectric resonance element (resonator element).

SUMMARY

An advantage of some aspects of the invention is to solve at least a part of the problems described above, and the invention can be implemented as the following forms or application examples.

APPLICATION EXAMPLE 1

This application example is directed to a resonation device including: a base substrate having a protruding portion; a heat generation portion; and a resonator element having a connection portion, wherein the heat generation portion is disposed in a region excluding the protruding portion of the base substrate, and the resonator element is disposed in the heat generation portion with the connection portion interposed therebetween, overlaps the protruding portion when seen in plan view, and has an area of the connection portion larger than an area of the protruding portion when seen in plan view.

According to this application example, since the area of the connection portion in which the heat generation portion and the resonator element are connected to each other is larger than the area of the connection portion between the resonator element and the protruding portion when seen in plan view, the amount of heat given to the resonator element from the heat generation portion becomes larger than a heat loss escaping from the protruding portion close to the resonator element to the base substrate. Thereby, it is possible to prevent the temperature of the resonator element from decreasing, and to stably maintain the temperature of the resonator element. In addition, since the resonator element is configured such that the (vertical) movement thereof in a direction perpendicular to the main surface of the resonator element is restricted by the protruding portion, in addition to the connection of the connection portion, it is possible to achieve the stability of the connection posture (arrangement posture) of the resonator element and an improvement in its impact resistance strength or the like.

APPLICATION EXAMPLE 2

This application example is directed to the resonation device according to the application example described above, wherein a centroid of the resonator element is disposed in a region interposed between the connection portion and the protruding portion when seen in plan view.

According to this application example, since the centroid of the resonator element is located between the connection portion of the resonator element and the protruding portion disposed on the base substrate when seen in plan view, it is possible to achieve the stability of a connection posture and an improvement in connection strength, in the resonator element which is one-sidedly connected to the heat generation portion. Meanwhile, the phrase "when seen in plan view" as used herein refers to a state when seen from a direction perpendicular to the main surface of the resonator element.

APPLICATION EXAMPLE 3

This application example is directed to the resonation device according to the application example described above, wherein at least one protruding portion is disposed in each region separated by a virtual line passing through the connection portion and the centroid of the resonator element, in a direction intersecting the virtual line when seen in plan view.

According to this application example, since at least one protruding portion is provided in each region separated by the virtual line passing through the center of the connection portion and the centroid of the resonator element, in a direction intersecting the virtual line, it is possible to suppress the inclination of the resonator element in both directions with respect to the virtual line, and to further stabilize a connection posture in the resonator element.

APPLICATION EXAMPLE 4, APPLICATION EXAMPLE 5, and APPLICATION EXAMPLE 6

These application examples are directed to the resonation devices according to the application examples described above, wherein the protruding portion includes a material having a smaller thermal conductivity than that of the base substrate.

According to these application examples, since the protruding portion includes a material having a smaller thermal conductivity than that of the base substrate, it is possible to suppress an escape of heat of the resonator element to the base substrate due to the transfer of the heat to the protruding portion. Thereby, it is possible to prevent the temperature of the resonator element from decreasing, and to stably maintain the temperature of the resonator element.

APPLICATION EXAMPLE 7, APPLICATION EXAMPLE 8, APPLICATION EXAMPLE 9, and APPLICATION EXAMPLE 10

These application examples are directed to the resonation devices according to the application examples, wherein the heat generation portion includes a heat generating body and a thermally-conductive layer which is thermally bonded to the heat generating body and is disposed on the heat generating body with an intermediate layer interposed therebetween, and the resonator element is connected to the thermally-conductive layer.

According to these application examples, since the thermally-conductive layer of the heat generation portion to which the resonator element is connected is thermally bonded to the heat generating body and is disposed on the heat generating body with the intermediate layer interposed therebetween, it is possible to efficiently transfer heat from the heat generating body to the thermally-conductive layer, and to further efficiently transfer heat to the resonator element.

APPLICATION EXAMPLE 11, APPLICATION EXAMPLE 12, APPLICATION EXAMPLE 13, APPLICATION EXAMPLE 14, and APPLICATION EXAMPLE 15

These application examples are directed to electronic devices including the resonation devices according to the application examples described above.

According to these application examples, since the resonation device is used in which the resonator element having a stable temperature is connected at high strength, and stable characteristics are maintained, it is possible to provide an electronic device having stable characteristics.

Application Example 16, Application Example 17, Application Example 18, Application Example 19, and Application Example 20

These application examples are directed to moving objects including the resonation devices according to the application examples described above.

According to these application examples, since the resonation device is used in which the resonator element having a stable temperature is connected at high strength, and stable characteristics are maintained, it is possible to provide a moving object having stable characteristics.

BRIEF DESCRIPTION OF THE DRAWINGS

The invention will be described with reference to the accompanying drawings, wherein like numbers reference like elements.

FIG. 1A is a plan view, and FIG. 1B is a front cross-sectional view.

FIGS. 2A to 2C are partially enlarged views illustrating the details of a connection portion of the resonation device according to the first embodiment; FIG. 2A is a left side view, FIG. 2B is a plan view, and FIG. 2C is a front cross-sectional view.

FIG. 3A is a front cross-sectional view illustrating Configuration Example 1, and FIG. 3B is a front cross-sectional view illustrating Configuration Example 2.

FIG. 4A is a plan view illustrating Modification Example 1 of the protruding portion, FIG. 4B is a front cross-sectional view of FIG. 4A, FIG. 4C is a plan view illustrating Modification Example 2 of the protruding portion, and FIG. 4D is a front cross-sectional view of FIG. 4C.

FIG. 5A is a plan view, and FIG. 5B is a front cross-sectional view.

FIG. 6A is a plan view, and FIG. 6B is a front cross-sectional view.

FIG. 7A is a left side view, FIG. 7B is a plan view, and FIG. 7C is a front cross-sectional view.

DESCRIPTION OF EXEMPLARY EMBODIMENTS

Figure 1A:
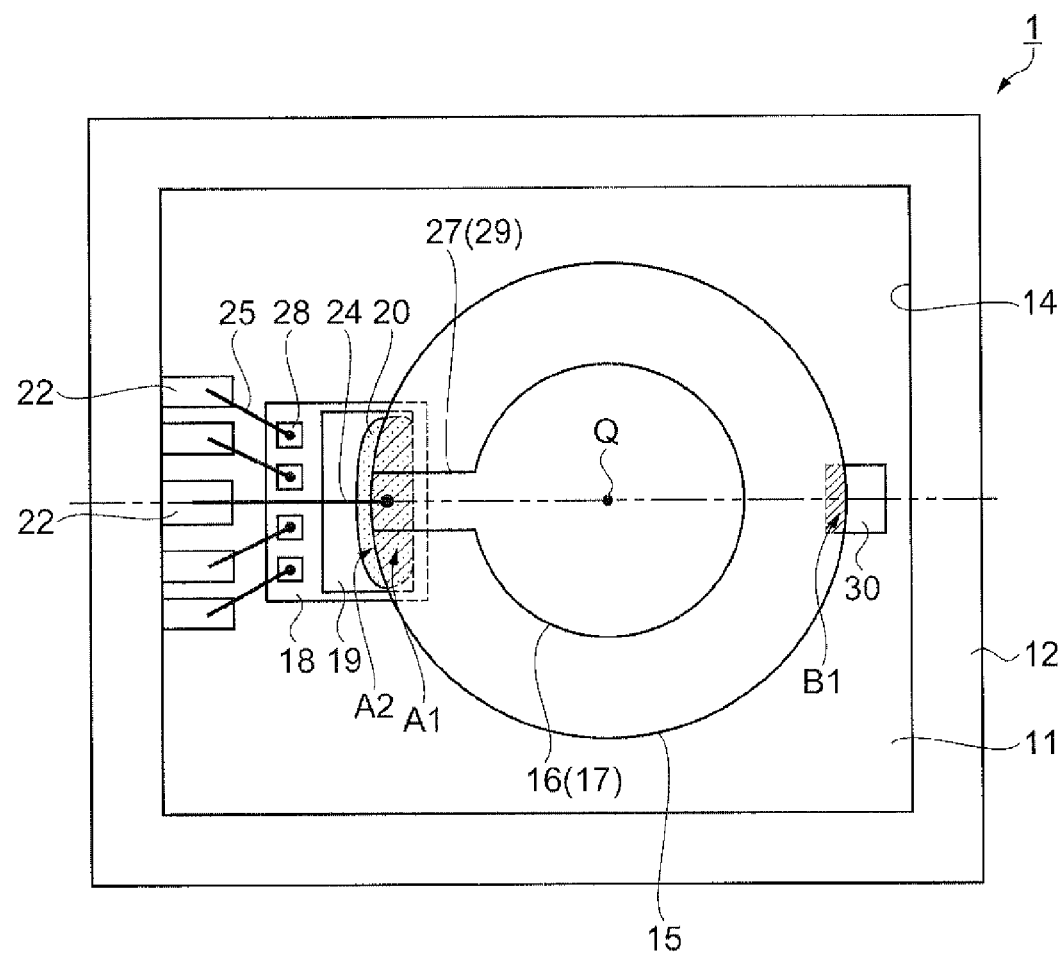
FIGS. 1A and 1B are diagrams illustrating an outline of a resonation device according to a first embodiment of the invention.
Figure 1B:
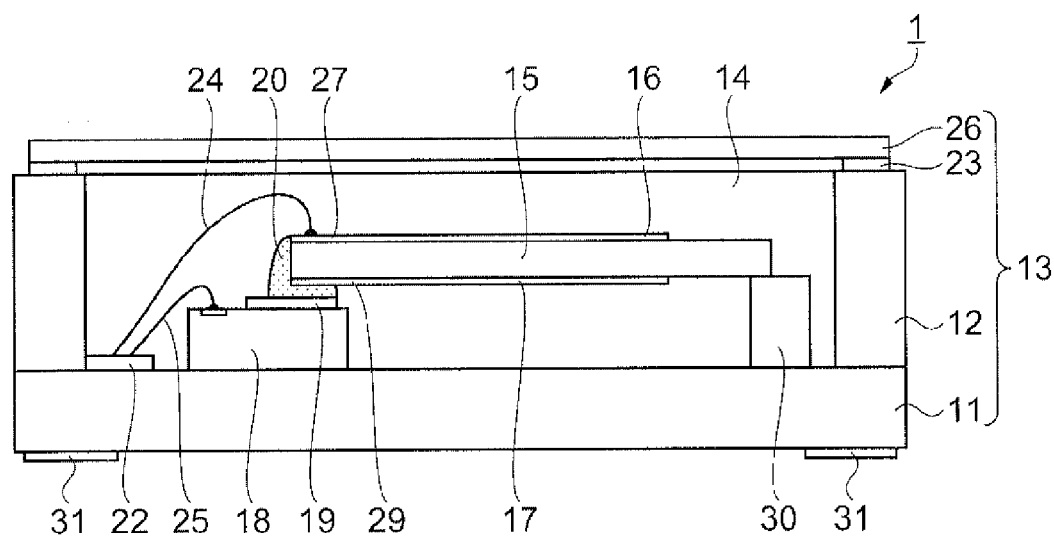
Figure 3A:
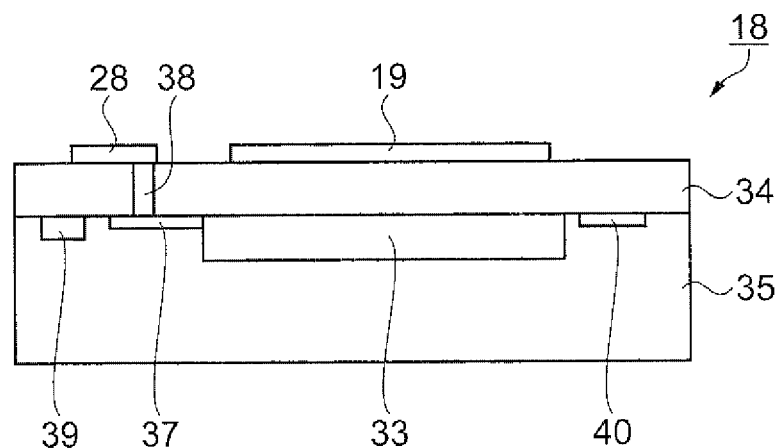
FIGS. 3A and 3B are diagrams schematically illustrating an outline of a heat generation element as a heat generation portion.
Figure 3B:
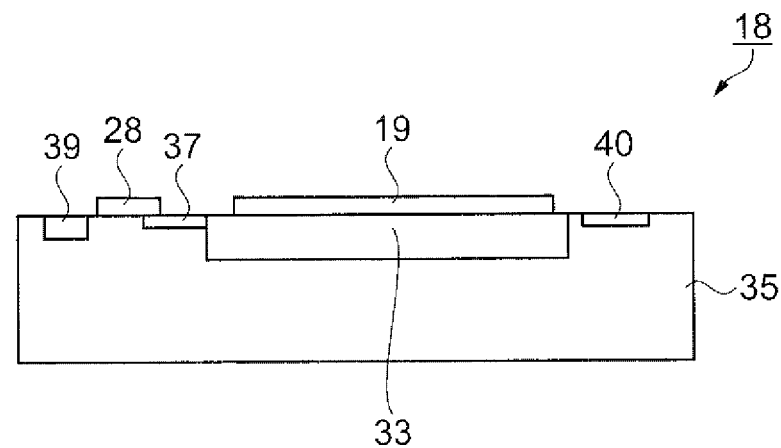

Hereinafter, preferred embodiments of the invention will be described with reference to the accompanying drawings.
First Embodiment A resonation device according to a first embodiment of the invention will be described with reference to FIG. 1A to FIG. 3C. FIGS. 1A and 1B are diagrams illustrating an outline of the resonation device according to the first embodiment of the invention; FIG. 1A is a plan view, and FIG. 2B is a front cross-sectional view. Meanwhile, in FIG. 1A, a lid member is omitted (in perspective). FIGS. 2A to 2C are partially enlarged views illustrating the details of a connection portion of the resonation device according to the first embodiment; FIG. 2A is a left side view, FIG. 2B is a plan view, and FIG. 2C is a front cross-sectional view. Meanwhile, in FIG. 2B, a connection electrode on the upper side of a resonator element is omitted. FIGS. 3A and 3B are front cross-sectional views schematically illustrating an outline of a heat generation element as a heat generation portion.

The resonation device according to the first embodiment of the invention is a so-called temperature controlled resonation device having the vibration element (resonator element) and the heat generation portion stored in a package. Hereinafter, the resonation device according to the first embodiment will be described in detail.

Resonation Device

A resonation device 1 shown in FIGS. 1A and 1B includes a resonator element 15, a package 13 that stores the resonator element 15, a heat generation element 18 as a heat generation portion, connected to the resonator element 15, which heats the resonator element 15, a protruding portion 30, provided in the package 13, which overlaps the resonator element 15 when seen in plan view, and a lid 26 as a lid body in which an internal space (storage space) 14 is formed between the package 13 and the lid. Hereinafter, the resonator element 15, the package 13, the heat generation element 18, the protruding portion 30, and the lid 26 will be sequentially described in detail.

Resonator Element

As the resonator element 15 of the present embodiment, an AT cut quartz crystal substrate (piezoelectric substrate) formed of quartz crystal as an example of a piezoelectric material is used. Although not shown, the piezoelectric material such as quartz crystal belongs to a trigonal system, and has crystal axes X, Y, and Z which are orthogonal to each other. The X axis, the Y axis, and the Z axis are called an electrical axis, a mechanical axis, and an optical axis, respectively. As the quartz crystal substrate, a flat plate is used which is cut out from quartz crystal along a plane obtained by rotating the XZ plane by a predetermined angle θ about the X axis. For example, in a case of the AT cut quartz crystal substrate, θ is approximately 35° 15'. Meanwhile, the Y axis and the Z axis are also rotated by θ about the X axis, and are set to a Y' axis and a Z' axis, respectively. Therefore, the AT cut quartz crystal substrate has crystal axes X, Y', and Z' which are orthogonal to each other. The AT cut quartz crystal substrate is configured such that the thickness direction thereof is the Y' axis, the XZ' plane (plane including the X axis and the Z' axis) orthogonal to the Y' axis is a main surface, and thickness-shear vibration is excited as main vibration. The AT cut quartz crystal substrate is processed, and thus it is possible to obtain a piezoelectric substrate as an element sheet for the resonator element 15. That is, the piezoelectric substrate is formed of an AT cut quartz crystal substrate in which an axis obtained by inclining the Z axis to a −Y direction of the Y axis is set to the Z' axis, an axis obtained by inclining the Y axis to a +Z direction of the Z axis is set to the Y' axis, with reference to the X axis of an orthogonal coordinate system composed of the X axis (electrical axis), the Y axis (mechanical axis), and the Z axis (optical axis), and a direction parallel to the Y' axis is set to thickness, constituted by a plane parallel to the X axis and the Z' axis.

Meanwhile, the quartz crystal substrate according to the invention is not limited to an AT cut having an angle θ, as mentioned above, of approximately 35° 15', but other piezoelectric substrates such as an SC cut and a BT cut that excite the thickness-shear vibration can also be widely applied thereto.

As shown in FIGS. 1A and 1B, the resonator element 15 of the present embodiment has various electrodes formed on an element piece of the AT cut quartz crystal substrate (piezoelectric substrate) which is formed in a disk shape by quartz crystal as an example of a piezoelectric material. In this example, excitation electrodes 16 and 17 and connection electrodes 27 and 29 are formed as various electrodes.

The substantially circular excitation electrode 16 is formed on the central portion of the upper main surface in the resonator element 15. The connection electrode 27 extending out from the excitation electrode 16 is formed on one end of the upper main surface. In addition, the substantially circular excitation electrode 17 is formed on the central portion of the lower main surface in the resonator element 15 so as to face the excitation electrode 16 on the upper side. The connection electrode 29 extending out from the excitation electrode 17 is formed on one end on the lower main surface. Meanwhile, the connection electrodes 27 and 29 on the upper and lower sides are formed in substantially the same shape so as to face each other.

Package

The package 13 as a base substrate shown in FIGS. 1A and 1B includes a bottom plate 11, a frame-like sidewall 12 provided in the periphery of the surface of the bottom plate 11, a seam ring 23 as a bonding material provided on the upper surface of the sidewall 12, and the lid 26 as a lid member bonded to the upper surface of a sidewall 202 through the seam ring 23. The seam ring 23 as a bonding material is provided on the upper surface of the sidewall 12. The package 13 stores the resonator element 15 and the heat generation element 18. Meanwhile, the lid 26 will be described later in detail.

As shown in FIGS. 1A and 1B, the package 13 as a base substrate has a concave portion (internal space 14) opened on the upper surface. An opening of the concave portion is blocked by the lid 26 as a lid member which is bonded to the sidewall 12 through the seam ring 23 as a bonding material. The opening of the concave portion of the package 13 is blocked and thus the sealed internal space 14 (see FIG. 1B) is formed. The internal pressure of the sealed internal space 14 can be set to a desired atmospheric pressure. For example, the internal pressure is set to the atmospheric pressure in which nitrogen gas is filled into the internal space 14, or is set to a vacuum (state of a space filled with a gas of a pressure ($1 \times 10^5$ Pa to $1 \times 10^{-1}$ Pa or lower (JIS Z 8126-1: 1999)) lower than the normal atmospheric pressure), and thus it is possible for the more stable vibration of the resonator element 15 to continue. Meanwhile, the internal space 14 of the present embodiment is set to have the above-mentioned vacuum. In addition, it is preferable that the internal space 14 used in the resonation device 1 of the present embodiment have the opening of the concave portion of the package 13 blocked and sealed therein, and be set to have atmospheric pressure in which nitrogen gas is filled therein, or be set to have a vacuum (pressure (state of a space filled with a gas of $1 \times 10^5$ Pa to $1 \times 10^{-10}$ Pa or lower) lower than the normal atmospheric pressure), but resonation devices having other configurations are not limited thereto. For example, in a configuration such an oscillator described later, a configuration exposed to the air may be used.

The frame-like sidewall 12 provided in the periphery of the surface of the plate-like bottom plate 11 is provided in a substantially rectangular circumferential shape. In other words, the opening shape opened on the upper surface of the above concave portion is substantially rectangular. The concave portion surrounded by the plate-like bottom plate 11 and the frame-like sidewall 12 serves as the internal space (storage space) 14 that stores the resonator element 15. The seam ring 23 formed of an alloy such as, for example, Kovar is provided on the upper surface of the frame-like sidewall 12. The seam ring 23 has a function as a bonding material between the lid 26 as a lid member and the sidewall 12, and is provided in a frame shape (substantially rectangular circumferential shape) along the upper surface of the sidewall 12.

The package 13 is formed of a material having a thermal expansion coefficient which is consistent with, or as close as possible to, the thermal expansion coefficients of the resonator element 15, the heat generation element 18, and the lid 26. In this example, ceramic is used. The package 13 is formed by laminating and sintering a green sheet formed in a predetermined shape. Meanwhile, the green sheet is, for example, a material in which a kneaded material generated by dispersing ceramic powder in a predetermined solution and adding a binder is formed in a sheet shape.

A PAD electrode 22 is provided on the bottom plate 11 constituting the bottom of the package 13. The PAD electrode 22 is formed by performing baking after the formation of a required shape using, for example, a conductive paste such as silver and palladium or tungsten metallization, and then plating nickel, and gold, silver or the like. The PAD electrode 22 is provided at five places in this example so as to be connected to the connection electrode 27 of the resonator element 15 described later and the heat generation element 18. Meanwhile, some elements in the PAD electrode 22 are electrically connected to an external connection electrode 31 formed on the outer bottom of the package 13.

Heat Generation Element

The outline of the heat generation element as a heat generation portion will be described with reference to FIGS. 3A and 3B. FIGS. 3A and 3B are diagrams schematically illustrating an outline of the heat generation element as a heat generation portion; FIG. 3A is a front cross-sectional view illustrating Configuration Example 1, and FIG. 3B is a front cross-sectional view illustrating Configuration Example 2. The heat generation element 18 shown in FIGS. 3A and 3B is an electronic component that heats the resonator element 15 connected thereto, keeps the temperature of the resonator element 15 constant, and has a so-called constant temperature function.

As shown in FIG. 3A, the heat generation element 18 as Configuration Example 1 is configured such that a heat generating body 33, a temperature sensor 40, a functional element 39, and the like which are constituted by a power transistor and the like are arranged on the functional surface side of a substrate 35 formed of a semiconductor and the like. The heat generating body 33 is temperature-controlled by the temperature sensor 40, and can maintain a constant temperature. An intermediate layer 34 which is an electrically insulating body is provided on the functional surface. A thermally-conductive layer 19 provided so as to face the heat generating body 33, and a bonding pad 28 connected to the heat generating body 33, the functional element 39 or the like using a connection wiring layer 37, another interconnect layer (not shown), a through electrode 38 or the like are provided on the upper surface of the intermediate layer 34. The thermally-conductive layer 19 is provided so as to face the heat generating body 33, and thus heat (heat energy) from the heat generating body 33 can be transferred to the thermally-conductive layer 19 over a large area. In other words, heat of the heat generating body 33 is efficiently transferred to the thermally-conductive layer 19.

As shown in FIG. 3B, the heat generation element 18 as Configuration Example 2 is configured such that the heat generating body 33, the temperature sensor 40, the functional element 39 and the like which are constituted by a power transistor and the like are arranged on the functional surface side of the substrate 35 formed of a semiconductor and the like. The heat generating body 33 is temperature-controlled by the temperature sensor 40, and can maintain a constant temperature. The thermally-conductive layer 19 provided so as to face the heat generating body 33, and the bonding pad 28 connected to the heat generating body 33, the functional element 39 or the like using the connection wiring layer 37, another interconnect layer (not shown) or the like are provided on the functional surface of the substrate 35. The thermally-conductive layer 19 is provided so as to face to the heat generating body 33, and thus heat (heat energy) from the heat generating body 33 can be transferred to the thermally-conductive layer 19 over a large area. In other words, heat of the heat generating body 33 is efficiently transferred to the thermally-conductive layer 19.

Meanwhile, the configuration of the heat generation element 18 described in Configuration Example 1 and Configuration Example 2 mentioned above is an example, and the configuration of the heat generation element is not limited thereto. The heat generation element 18 may have another configuration.

As shown in FIGS. 1A and 1B, the heat generation element 18 is fixed to the bottom plate 11 constituting the package 13 by a resin adhesive (not shown) or the like. The heat generation element 18 is configured such that the resonator element 15 is connected onto the thermally-conductive layer 19. The details of the connection will be described in paragraphs (connection of the resonator element) mentioned later. Each of the bonding pads 28 provided in the heat generation element 18 is an electric external connection electrode, and is electrically connected to the PAD electrode 22 provided on the bottom plate 11 of the package 13 by a metal interconnection (bonding wire) 25. Meanwhile, some elements within the PAD electrode 22 are electrically connected to the external connection electrode 31 formed on the outer bottom of the package 13.

Protruding Portion

Next, returning to FIGS. 1A and 1B, the protruding portion 30 will be described. The protruding portion 30 is provided on the upper surface of the bottom plate 11 of the package 13. The protruding portion 30 has a substantially rectangular column shape, and the upper end surface thereof overlaps the resonator element 15 when seen in plan view. A region in which the upper end surface of the protruding portion 30 shown by a hatched portion in FIG. 1A and the resonator element 15 overlap each other when seen in plan view is set to an overlapping portion B1 of the resonator element 15. The protruding portion 30 is provided so that a centroid Q is located between a connection portion of the protruding portion 30 to the resonator element 15 and a connection portion of the resonator element 15 to the heat generation element 18 described later, when seen in plan view. In the present embodiment, the overlapping portion B1 is provided at a position which is substantially point-symmetric with respect to the connection portion of the resonator element 15 to the heat generation element 18 on the basis of the centroid Q of the resonator element, when seen in plan view. Meanwhile, the phrase "when seen in plan view" as used herein refers to a state when seen from a direction perpendicular to the main surface of the resonator element 15.

In this manner, the protruding portion 30 (overlapping portion B1) is disposed, and thus a slope by which the protruding portion side of the resonator element 15 inclines so as to come close to the bottom plate 11 side, which possibly occurs on the protruding portion 30 side of the resonator element 15 one-sidedly connected to the heat generation element 18 as a heat generation portion, can be prevented from being caused by virtue of a function of the protruding portion 30 as a support. Thereby, it is possible to stabilize the connection posture of the resonator element 15. In addition, since the protruding portion 30 has a function of restricting the movement of the resonator element in a (vertical) direction perpendicular to the main surface of the resonator element 15, the vertical movement of the resonator element 15 is restricted when an impact is applied to the resonator element 15, thereby allowing an improvement in its impact resistance strength or the like to be achieved.

Meanwhile, the protruding portion 30 may have a rectangular column shape, and may be of any shape such as, for example, trapezoidal, cylindrical, and polygonal insofar as the resonator element 15 can be placed. In addition, in the above-mentioned example, although a description is given in a state where the resonator element 15 and the protruding portion 30 overlap each other when seen in plan view, a configuration is shown in which the resonator element 15 and the overlapping portion B1 of the protruding portion 30 are not in contact with each other, but the resonator element 15 and the overlapping portion B1 of the protruding portion 30 may be in contact with each other without being limited thereto.

Modification Example of Protruding Portion

In addition, the protruding portion 30 may be configured such that a plate-like stepped portion is formed by disposing one layer of another substrate on the bottom plate 11, for example, as a portion of the configuration in which the package 13 is formed, and a portion of the stepped portion is used as the protruding portion 30.

Figure 4A:
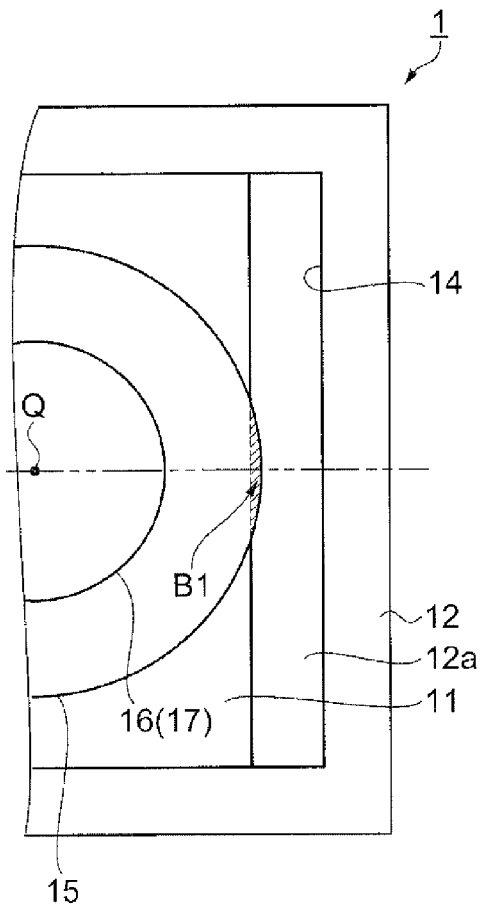
FIGS. 4A to 4D are diagrams illustrating modification examples of a protruding portion.
Figure 4C:
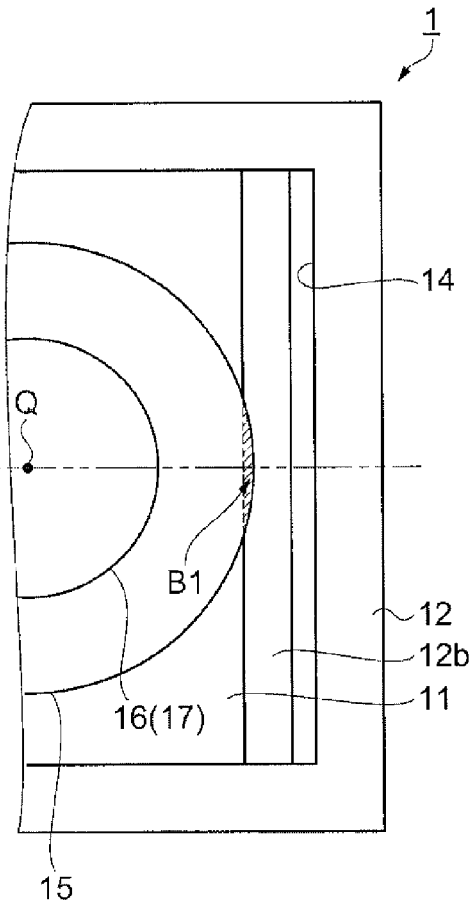
Figure 4B:
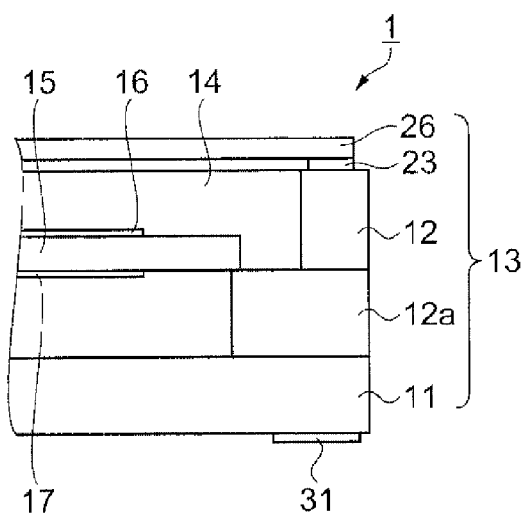
Figure 4D:
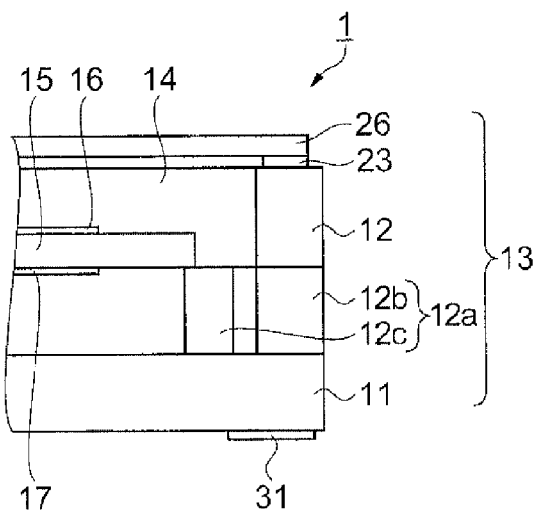

Such a form will be described with reference to FIGS. 4A to 4D. FIGS. 4A to 4D are diagrams illustrating modification examples of the protruding portion; FIG. 4A is a plan view illustrating Modification Example 1 of the protruding portion, FIG. 4B is a front cross-sectional view of FIG. 4A, FIG. 4C is a plan view illustrating Modification Example 2 of the protruding portion, and FIG. 4D is a front cross-sectional view of FIG. 4C.

Modification Example 1 of Protruding Portion

In Modification Example 1 of the protruding portion shown in FIGS. 4A and 4B, one more layer of a frame plate 12a is provided between the bottom plate 11 and the sidewall 12 constituting the package 13 of the resonation device 1. The frame plate 12a can be formed with the same material and manufacturing process as those of the bottom plate 11 and the like. The frame plate 12a is extended to the internal space 14 on the bottom plate 11 corresponding to the side at which the resonator element 15 is located, and is disposed so as to form a stepped portion having a difference in level at a position slightly overlapping the end of the resonator element 15 when seen in plan view. The overlapping portion B1 is provided so that a portion of the resonator element 15 overlaps a portion of the upper surface of the stepped portion of the extended frame plate 12a, when seen in plan view. In this case, a region in which the stepped portion shown by a hatched portion in the drawing and the resonator element 15 overlap or contact each other when seen in plan view is set to the overlapping portion B1. Since the frame plate 12a in the protruding portion of Modification Example 1 can be formed with the same material and manufacturing process as those of the bottom plate 11 and the like, it is possible to provide the protruding portion easily and simply.

Modification Example 2 of Protruding Portion

In Modification Example 2 of the protruding portion shown in FIGS. 4C and 4D, one more layer of the frame plate 12a is provided between the bottom plate 11 and the sidewall 12 constituting the package 13 of the resonation device 1. The frame plate 12a is provided with a sidewall portion 12b provided in a portion overlapping the sidewall 12 and a stepped portion 12c disposed separately from the sidewall portion 12b and disposed on the bottom plate 11. The frame plate 12a, including the stepped portion 12c, can be formed with the same material and manufacturing process as those of the bottom plate 11 and the like. The stepped portion 12c is disposed so that in the internal space 14 on the bottom plate 11 corresponding to the side at which the resonator element 15 is located, a position slightly overlapping the end of the resonator element 15 when seen in plan view has a difference in level. The overlapping portion B1 is provided so that a portion of the resonator element 15 overlaps a portion of the upper surface of the stepped portion 12c, when seen in plan view. In this case, a region in which the stepped portion shown by a hatched portion in the drawing and the resonator element 15 overlap or contact each other when seen in plan view is set to the overlapping portion B1. Since the frame plate 12a constituting the stepped portion 12c as the protruding portion of Modification Example 2 can be formed with the same material and manufacturing process as those of the bottom plate 11 and the like, it is possible to provide the protruding portion easily and simply. In addition, since the stepped portion 12c is provided separately from the sidewall portion 12b, it is possible to suppress an escape (heat loss) of heat (heat energy) of the resonator element 15 to the sidewall portion 12b.

Meanwhile, in Modification Example 1 and Modification Example 2 shown in FIGS. 4A to 4D, an example is described in which the stepped portion is provided along one lateral side of the package 13, but a configuration may be used in which the stepped portion is provided along at least one of other lateral sides in a direction intersecting the lateral side shown in this example.

In addition, it is preferable that the protruding portion 30 be formed of a material having a smaller thermal conductivity than that of the material of the bottom plate 11 of the package 13. Alternatively, it is preferable that a heat insulating portion having a small thermal conductivity be provided in a portion of the protruding portion 30. In the configuration shown in the above-mentioned example, since the resonator element 15 and the protruding portion 30 are close to or in contact with each other, there is a tendency for heat (heat energy) of the resonator element 15 to be transferred to the protruding portion 30 by radiation or conduction. Therefore, in this manner, at least a portion of the protruding portion 30 is formed of a material having a small thermal conductivity, and thus it is possible to suppress an escape (heat loss) of heat (heat energy) of the resonator element 15 to the bottom plate 11 through the protruding portion 30 which is close to or in contact with the resonator element 15.

Connection of Resonator Element

The connection of the resonator element 15 to the heat generation element 18 will be described with reference to FIGS. 2A to 2C, in addition to FIGS. 1A and 1B. The resonator element 15 is stored within the concave portion surrounded by the sidewall 12 of the package 13, and is connected onto the thermally-conductive layer 19 of the heat generation element 18 fixed to the bottom plate 11 by an adhesive or the like, using a conductive adhesive 20 (see FIGS. 1A and 1B). The resonator element 15 is disposed so that a portion of the connection electrode 29 on the lower main surface side and a portion of the thermally-conductive layer 19 face each other, and has a connection portion A1

(hatched portion in the drawing) which is a region having the conductive adhesive 20 interposed therein and a connection portion A2 (hatched portion in the drawing) which is a region having the conductive adhesive 20 interposed on the lateral end surface. The resonator element 15 is connected onto the thermally-conductive layer 19 of the heat generation element 18, in a connection region obtained by adding the connection portion A1 and the connection portion A2.

Here, the resonator element 15, the heat generation element 18, and the protruding portion 30 are disposed so that the area of the connection region (area of the connection portion) obtained by adding the area of the connection portion A1 and the area of the connection portion A2 becomes larger than the area of the overlapping portion B1 between the protruding portion 30 and the resonator element 15 (see FIGS. 1A and 1B). The resonator element 15 is connected onto the thermally-conductive layer 19 of the heat generation element 18 in a state where the above-mentioned area (A1+A2) of the connection portions A1 and A2 and the area (B1) of the overlapping portion B1 are in the aforementioned relation.

The relation between the area of the connection region (area of the connection portion A1+area of the connection portion A2) and the area of the overlapping portion B1 as mentioned above is established, and thus the amount of heat given to the resonator element 15 through the thermally-conductive layer 19 of the heat generation element 18 becomes larger than the amount of heat (amount of heat loss) escaping from the protruding portion 30 which is close to or in contact with the resonator element 15 to the bottom plate 11 of the package 13. Thereby, it is possible to prevent the temperature of the resonator element 15 from decreasing, stably maintain the temperature of the resonator element 15, reduce heating energy, and to achieve a reduction in power consumption.

The connection electrode 27 on the surface of the resonator element 15 is electrically connected to one PAD electrode 22, provided on the bottom plate 11 of the package 13, by a metal interconnection (bonding wire) 24. In addition, the connection electrode 29 on the rear surface of the resonator element 15 is electrically connected to one PAD electrode 22 through the thermally-conductive layer 19 of the heat generation element 18.

Lid as Lid Member

The lid 26 is a plate-like member, and blocks the opening of the concave portion opened on the upper surface of the package 13. The lid 26 is for bonding the periphery of the opening of the concave portion using, for example, a seam welding method or the like. Since the lid 26 of this example is plate-like, the lid is easily formed, and is excellent in shape stability. In addition, a plate material of Kovar is used in the lid 26 of this example. When sealing is performed by using a plate of Kovar in the lid 26, the seam ring 23 and the lid 26 which are formed of Kovar are molten in the same molten state, and are easily alloyed. Therefore, it is possible to perform sealing easily and reliably. Meanwhile, other plate materials may be used in the lid 26 as a substitute for Kovar, and a metal material such as, for example, 42 Alloy and stainless steel, the same material as that of the sidewall 12 of the package 13, or the like can be used in the lid.

According to the resonation device 1 of the first embodiment, the resonator element 15 is connected onto the thermally-conductive layer 19 of the heat generation element 18 so that a relation is established in which the area of the connection portions A1 and A2 (area of the connection portion A1+area of the connection portion A2) is larger than the area (area of the overlapping portion B1) of a region in which the resonator element 15 and the protruding portion 30 overlap each other when seen in plan view. In this manner, the resonator element 15 is connected onto the thermally-conductive layer 19, and thus the amount of heat given to the resonator element 15 through the thermally-conductive layer 19 of the heat generation element 18 becomes larger than the amount of heat (amount of heat loss) escaping from the protruding portion 30 to the bottom plate 11 of the package 13. Thereby, it is possible to prevent the temperature of the resonator element 15 from decreasing, stably maintain the temperature of the resonator element 15, and to achieve a reduction in power consumption by virtue of the possibility of heating energy being suppressed.

In addition, according to the resonation device 1, the protruding portion 30 is provided at a position which is substantially point-symmetric with respect to the connection portion of the resonator element 15 to the heat generation element 18 described later, on the basis of the centroid Q of the resonator element 15 when seen in plan view. In this manner, the protruding portion 30 (overlapping portion B1) is disposed, and thus a slope by which the protruding portion side of the resonator element inclines so as to come close to the bottom plate 11 side can be prevented from being caused, the slope having a tendency to occur on the protruding portion 30 side of the resonator element 15 which is one-sidedly connected to the heat generation element 18 as a heat generation portion. Thereby, it is possible to stabilize the connection posture of the resonator element 15. In addition, since the protruding portion 30 has a function of restricting the movement of the resonator element in a (vertical) direction perpendicular to the main surface of the resonator element 15, the vertical movement of the resonator element 15 is restricted when an impact is applied to the resonator element 15, thereby allowing an improvement in its impact resistance strength or the like to be achieved.

Meanwhile, although the above description is made using quartz crystal as a piezoelectric material of which the resonator element 15 is formed, the piezoelectric material is not limited thereto, but a piezoelectric material such as, for example, lithium tantalate and lithium niobate can also be used. In addition, the resonator element 15 may have a configuration in which a MEMS (Micro Electro Mechanical Systems) element having a resonator element formed on a silicon or glass substrate is used. In addition, the resonator element 15 may be a resonator element having a configuration in which a vibrating body is formed on a substrate such as a silicon or glass substrate.

In addition, although the above description is made by way of a configuration example in which the package 13 is used as means constituting the internal space 14 that stores the resonator element 15 and the like, a so-called can package-type configuration using a lid body having, for example, a substrate and a metal plate formed therein may be used, without being limited thereto. In this configuration, the lid body has a dented concave portion including a circumferential flange on the outer circumference, and the concave portion is used as a storage space. In a case of this configuration, configuration members such as the resonation device 1 and the heat generation element 18 are stored in the concave portion of the lid body which is formed by bonding the substrate and the flange portion of the lid body through, for example, seam welding, a bonding material such as a solder, or the like. Meanwhile, as the metal plate constituting the lid body, Kovar, a material obtained by performing plating on an iron-based metal, and the like can be used. In addition, the lid body when a bonding material such as a solder is used may have a configuration in which the flange portion provided circumferentially on the outer circumference of the lid body is not formed.

Second Embodiment

Figure 5A:
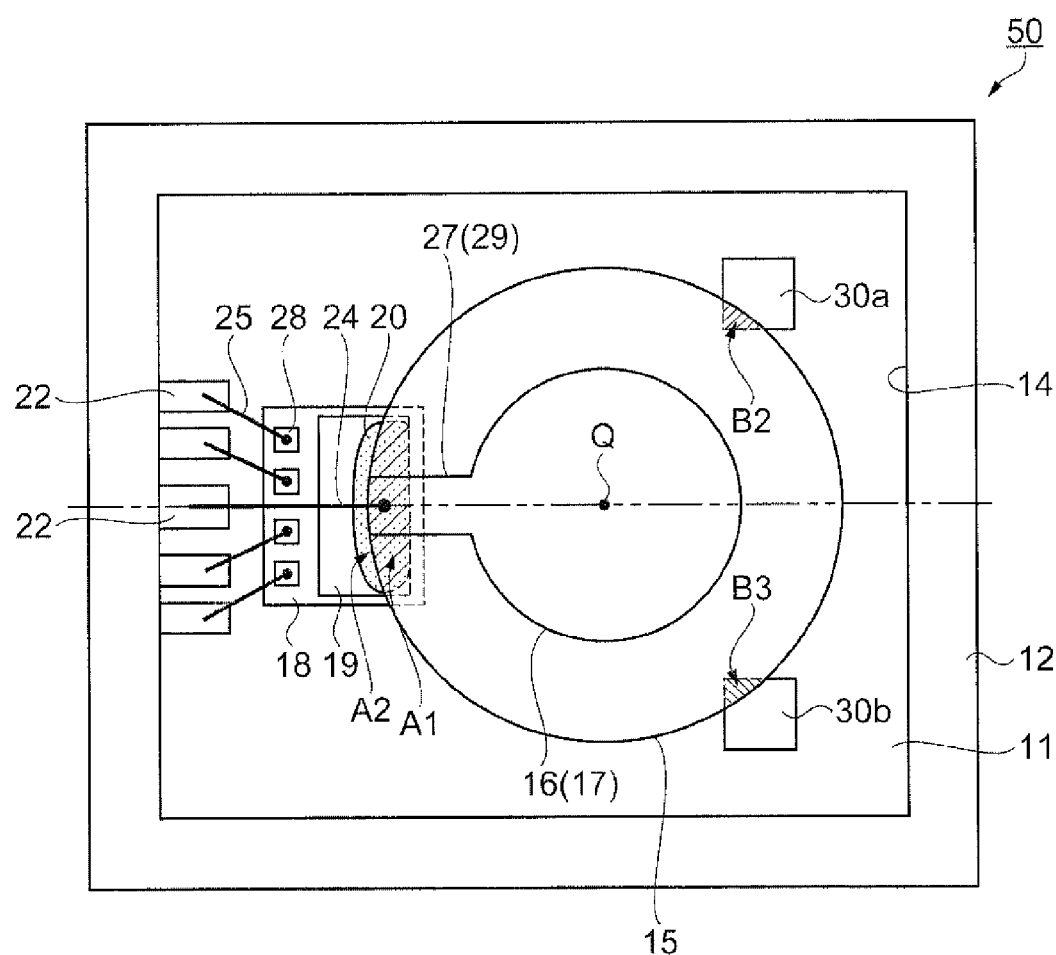
FIGS. 5A and 5B are diagrams illustrating an outline of a resonation device according to a second embodiment of the invention.
Figure 5B:
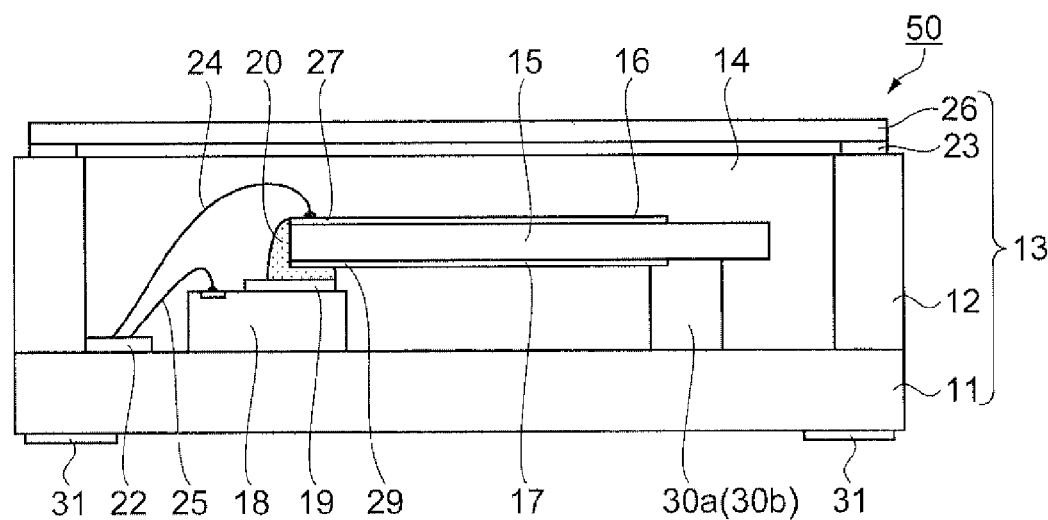

Next, a resonation device according to a second embodiment of the invention will be described with reference to FIGS. 5A and 5B. FIGS. 5A and 5B are diagrams illustrating an outline of the resonation device according to the second embodiment of the invention; FIG. 5A is a plan view, and FIG. 5B is a front cross-sectional view. Meanwhile, in FIG. 5A, the lid member is omitted (in perspective).

The resonation device according to the second embodiment of the invention is a so-called temperature controlled resonation device having the resonator element (resonator element) and the heat generation portion stored in a package, as is the case with the aforementioned first embodiment. A resonation device 50 according to the second embodiment is different from the resonation device 1 according to the first embodiment in the configuration of the protruding portion. Hereinafter, the resonation device 50 according to the second embodiment will be described in detail, but the same components as those of the resonation device 1 according to the aforementioned first embodiment are denoted by the same reference numerals and signs, and thus the description thereof may not be given.

Resonation Device

The resonation device 50 shown in FIGS. 5A and 5B includes a resonator element 15, a package 13 that stores the resonator element 15, a heat generation element 18 as a heat generation portion, connected to the resonator element 15, which heats the resonator element 15, two protruding portions 30a and 30b, provided in the package 13, which overlap the resonator element 15 when seen in plan view, and a lid 26 as a lid body in which an internal space (storage space) 14 is formed between the package 13 and the lid. Meanwhile, the resonator element 15, the package 13, the heat generation element 18, and the lid 26 have the same configurations as those of the resonation device 1 according to the aforementioned first embodiment, and thus the description thereof will not be given. The following description will be made with an emphasis on the protruding portions 30a and 30b and overlapping portions B2 and B3 of the resonator element 15 having configurations different from those of the resonation device 1 according to the first embodiment, and the connection between the resonator element 15 and the heat generation element 18.

Protruding Portion

In the resonation device 50 of the second embodiment, two protruding portions 30a and 30b are provided on the upper surface of the bottom plate 11 of the package 13. The protruding portions 30a and 30b have a substantially rectangular column shape, and the upper end surface thereof overlaps the resonator element 15 when seen in plan view. A region in which the upper end surface of the protruding portion 30a shown by a hatched portion in FIG. 5A and the resonator element 15 overlap each other when seen in plan view is set to an overlapping portion B2 of the resonator element 15. Similarly, a region in which the upper end surface of the protruding portion 30b shown by a hatched portion in FIG. 5A and the resonator element 15 overlap each other when seen in plan view is set to an overlapping portion B3 of the resonator element 15.

The protruding portions 30a and 30b are respectively provided one by one on both sides of a virtual line passing through a centroid Q of the resonator element 15 and a substantial center of a connection portion A1 between the resonator element 15 and the heat generation element 18 described later, when seen in plan view. Meanwhile, the phrase "when seen in plan view" as used herein refers to a state when seen from a direction perpendicular to the main surface of the resonator element 15. The protruding portions 30a and 30b are provided at positions which are line-symmetric with respect to the aforementioned virtual line, but may not be necessarily line-symmetric with respect thereto, and at least one of the protruding portions may be provided on both sides of the aforementioned virtual line. In this manner, the protruding portions 30a and 30b are disposed, and thus it is possible to suppress the inclination of the resonator element 15 in both directions with respect to the virtual line, and to further stabilize the connection posture of the resonator element 15. In addition, since the protruding portions 30a and 30b have a function of restricting the movement of the resonator element in a (vertical) direction perpendicular to the main surface of the resonator element 15, the vertical movement of the resonator element 15 is restricted when an impact is applied to the resonator element 15, thereby allowing an improvement in its impact resistance strength or the like to be achieved.

Meanwhile, the protruding portions 30a and 30b may have a rectangular column shape, and may be of any shape such as, for example, trapezoidal, cylindrical, and polygonal insofar as the resonator element 15 can be placed. In addition, in the above-mentioned example, although a description is given in a state where the resonator element 15 and the protruding portions 30a and 30b overlap each other when seen in plan view, a configuration is shown in which the overlapping portion B2 between the resonator element 15 and the protruding portion 30a and the overlapping portion B3 between the resonator element and the protruding portion 30b are not in contact with each other, but the resonator element 15, and the overlapping portion B2 of the protruding portion 30a and the overlapping portion B3 of the protruding portion 30b may be in contact with each other without being limited thereto.

In addition, the protruding portions 30a and 30b may be configured such that a plate-like stepped portion is formed by disposing one layer of another substrate on the bottom plate 11 on both sides of the aforementioned virtual line, for example, as a portion of the configuration in which the package 13 is formed, and a portion of the stepped portion is used as the protruding portions 30a and 30b. In this case, the overlapping portion B2 and the overlapping portion B3 are provided so that a portion of the resonator element 15 is applied to a portion of the upper surface of the stepped portion. Meanwhile, the configuration of the overlapping portion B2 and the overlapping portion B3 described herein is the same as the configuration described with reference to FIGS. 4A and 4B in the aforementioned first embodiment.

In addition, it is preferable that the protruding portions 30a and 30b be formed of a material having a smaller thermal conductivity than that of the material of the bottom plate 11 of the package 13. Alternatively, it is preferable that a heat insulating portion having a small thermal conductivity be provided in a portion of the protruding portions 30a and 30b. In the configuration shown in the above-mentioned example, since the resonator element 15 and the protruding portions 30a and 30b are close to or in contact with each other, there is tendency for heat (heat energy) from the resonator element 15 to be transferred to the protruding portions 30a and 30b by radiation or conduction. Therefore, in this manner, at least a portion of the protruding portions 30a and 30b is formed of a material having a small thermal conductivity, and thus it is possible to suppress an escape (heat loss) of heat (the amount of heat) of the resonator element 15 to the bottom plate 11 through the protruding portions 30a and 30b.

Connection of Resonator Element

As is the case with the aforementioned first embodiment, the resonator element 15 is stored within the concave portion surrounded by the sidewall 12 of the package 13, and is connected onto the thermally-conductive layer 19 of the heat generation element 18 fixed to the bottom plate 11 by a resin adhesive (not shown) or the like, using a conductive adhesive 20. The resonator element 15 is disposed so that a portion of the connection electrode 29 on the lower main surface side and a portion of the thermally-conductive layer 19 face each other, and has a connection portion A1 (hatched portion in the drawing) which is a region having the conductive adhesive 20 interposed therein and a connection portion A2 (see a hatched portion shown in FIGS. 2A and 2B) which is a region having the conductive adhesive 20 interposed on the lateral end surface. The resonator element 15 is connected onto the thermally-conductive layer 19 of the heat generation element 18, in a connection region obtained by adding the connection portion A1 and the connection portion A2.

Here, the resonator element 15, the heat generation element 18, and the protruding portions 30a and 30b are disposed so that the area of the connection region (area of the connection portion) obtained by adding the area of the connection portion A1 and the area of the connection portion A2 becomes larger than the area obtained by adding the area of the overlapping portion B2 between the protruding portion 30a and the resonator element 15 and the area of the overlapping portion B3 between the protruding portion 30b and the resonator element 15. The resonator element 15 is connected onto the thermally-conductive layer 19 of the heat generation element 18 in a state where the above-mentioned area of the connection region (area of the connection portion A1+area of the connection portion A2) and the area (area of the overlapping portion B2+area of the overlapping portion B3) of the region in which the resonator element 15 and the protruding portions 30a and 30b overlap each other, when seen in plan view, are in the aforementioned relation.

In this manner, the area of the connection region (area of the connection portion A1+area of the connection portion A2) is made larger than the area of the overlapping portion B2+the area of the overlapping portion B3, and thus the amount of heat given to the resonator element 15 through the thermally-conductive layer 19 of the heat generation element 18 becomes larger than the amount of heat (amount of heat loss) escaping from the protruding portions 30a and 30b to the bottom plate 11 of the package 13. Thereby, it is possible to prevent the temperature of the resonator element 15 from decreasing, stably maintain the temperature of the resonator element 15, and to achieve a reduction in power consumption by virtue of the possibility of heating energy being suppressed.

According to the resonation device 50 of the second embodiment, the resonator element 15 is connected onto the thermally-conductive layer 19 of the heat generation element 18 in a relation where the above-mentioned area of the connection portions A1 and A2 (area of the connection portion A1+area of the connection portion A2) is larger than the area of the overlapping portions B2 and B3 (area of the overlapping portion B2+area of the overlapping portion B3). In this manner, the resonator element 15 is disposed, and thus the amount of heat given to the resonator element 15 through the thermally-conductive layer 19 of the heat generation element 18 becomes larger than the amount of heat (amount of heat loss) escaping from the protruding portions 30a and 30b to the bottom plate 11 of the package 13. Thereby, it is possible to prevent the temperature of the resonator element 15 from decreasing, stably maintain the temperature of the resonator element 15, and to achieve a reduction in power consumption by virtue of the possibility of heating energy being suppressed.

In addition, according to the resonation device 50, the protruding portions 30a and 30b are respectively provided one by one on both sides of the virtual line passing through the centroid Q of the resonator element 15 and the substantial center of the connection portion A1 between the resonator element 15 and the heat generation element 18 described later, when seen in plan view. In this manner, the protruding portions 30a and 30b are disposed, and thus it is possible to suppress the inclination of the resonator element 15 in both directions with respect to the virtual line, and to further stabilize the connection posture of the resonator element 15. In addition, since the protruding portions 30a and 30b have a function of restricting the movement of the resonator element in a (vertical) direction perpendicular to the main surface of the resonator element 15, the vertical movement of the resonator element 15 is restricted when an impact is applied to the resonator element 15, thereby allowing an improvement in its impact resistance strength or the like to be achieved.

Third Embodiment

Figure 6A:
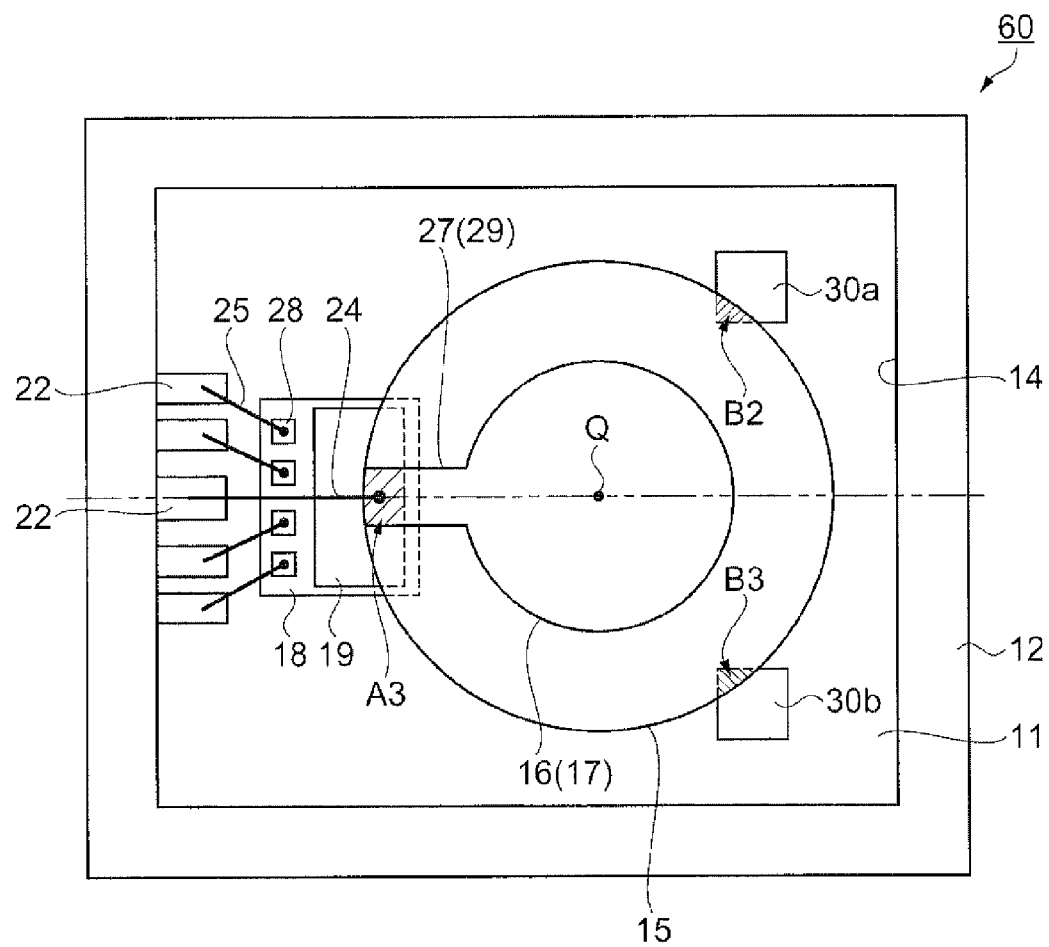
FIGS. 6A and 6B are diagrams illustrating an outline of a resonation device according to a third embodiment of the invention.
Figure 6B:
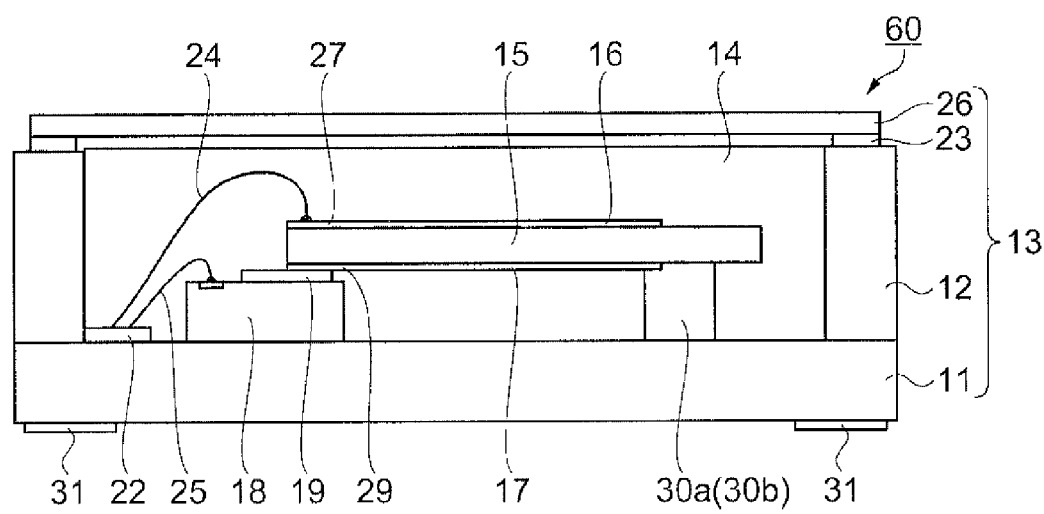
Figure 7A:
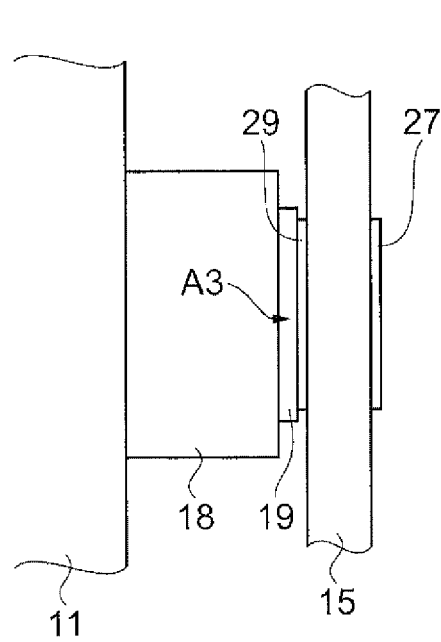
FIGS. 7A to 7C are partially enlarged views illustrating the details of a connection portion of the resonation device according to the third embodiment of the invention.
Figure 7B:
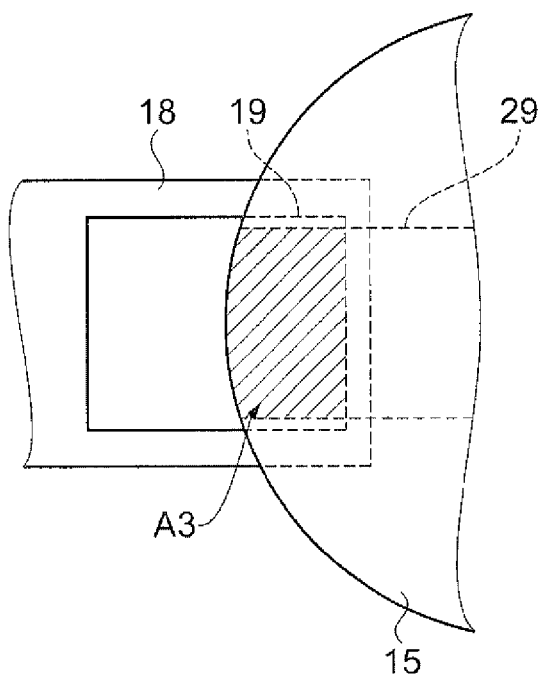
Figure 7C:
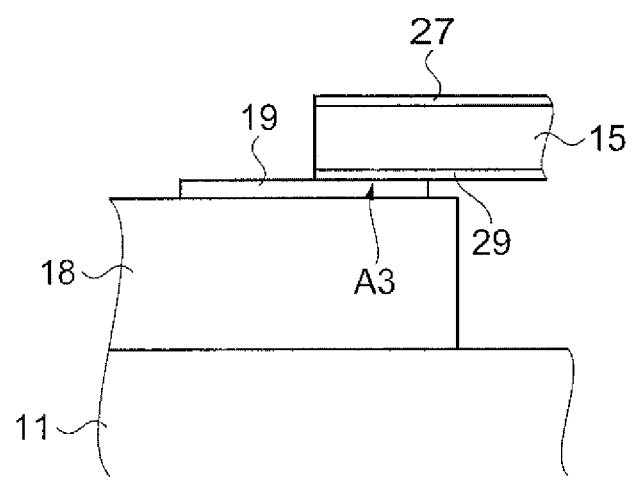

Next, a resonation device according to a third embodiment of the invention will be described with reference to FIGS. 6A to 7C. FIGS. 6A and 6B are diagrams illustrating an outline of the resonation device according to the third embodiment of the invention; FIG. 6A is a plan view, and FIG. 6B is a front cross-sectional view. Meanwhile, in FIG. 6A, the lid member is omitted (in perspective). FIGS. 7A to 7C are partially enlarged views illustrating the details of a connection portion of the resonation device according to the third embodiment; FIG. 7A is a left side view, FIG. 7B is a plan view, and FIG. 7C is a front cross-sectional view.

The resonation device according to the third embodiment of the invention is a so-called temperature controlled resonation device having the resonator element (resonator element) and the heat generation portion stored in a package, as is the case with the aforementioned second embodiment. A resonation device 60 according to the third embodiment is different from the resonation device 50 according to the second embodiment in a connection method of the resonator element 15. Hereinafter, the resonation device 60 according to the third embodiment will also be described in detail, but the same components as those of the resonation device 50 according to the aforementioned second embodiment are denoted by the same reference numerals and signs, and thus the description thereof may not be given.

Resonation Device

The resonation device 60 shown in FIGS. 6A and 6B includes a resonator element 15, a package 13 that stores the resonator element 15, a heat generation element 18 as a heat generation portion, connected to the resonator element 15, which heats the resonator element 15, two protruding portions 30a and 30b, provided in the package 13, which overlap the resonator element 15 when seen in plan view, and a lid 26 as a lid body in which an internal space (storage space) 14 is formed between the package 13 and the lid. Meanwhile, the resonator element 15, the package 13, the heat generation element 18, the protruding portions 30a and 30b, and the lid 26 have the same configurations as those of the resonation device 50 according to the aforementioned second embodiment, and thus the description thereof will not be given. The following description will be made with an emphasis on the connection between the resonator element 15 and the heat generation element 18 having configurations different from those of the resonation device 50 according to the second embodiment.

Connection of Resonator Element

As is the case with the aforementioned second embodiment, the resonator element 15 is stored within the concave portion surrounded by the sidewall 12 of the package 13, and is connected onto the thermally-conductive layer 19 of the heat generation element 18 fixed to the bottom plate 11 by a resin adhesive (not shown) or the like. The resonator element 15 is disposed so that a portion of the connection electrode 29 on the lower main surface side and a portion of the thermally-conductive layer 19 face each other, and is connected onto the heat generation element 18 by direct bonding between the connection electrode 29 and the thermally-conductive layer 19 using, for example, an ultrasonic eutectic alloy method or the like. Here, a region shown by a hatched portion in the drawing, on which the direct bonding between the connection electrode 29 and the thermally-conductive layer 19 is performed, is set to a connection portion A3.

Here, the resonator element 15, the heat generation element 18, and the protruding portions 30a and 30b are disposed so that the area of the connection portion A3 becomes larger than an area obtained by adding the area of the overlapping portion 32 between the protruding portion 30a and the resonator element 15 and the area of the overlapping portion B3 between the protruding portion 30b and the resonator element 15. The resonator element 15 is connected onto the thermally-conductive layer 19 of the heat generation element 18 in a state where the above-mentioned area of the connection region (area of the connection portion A3) and the area (area of the overlapping portion B2+area of the overlapping portion B3) of the region in which the resonator element 15 and the protruding portions 30a and 30b overlap each other, when seen in plan view, are in the aforementioned relation.

In this manner, the area of the connection region (area of the connection portion A3) is made larger than the area (area of the overlapping portion B2+area of the overlapping portion B3) of the region in which the resonator element 15 and the protruding portions 30a and 30b overlap each other, when seen in plan view, and thus the amount of heat given to the resonator element 15 through the thermally-conductive layer 19 of the heat generation element 18 becomes larger than the amount of heat (amount of heat loss) escaping from the protruding portions 30a and 30b to the bottom plate 11 of the package 13. Thereby, it is possible to prevent the temperature of the resonator element 15 from decreasing, stably maintain the temperature of the resonator element 15, and to achieve a reduction in power consumption by virtue of the possibility of heating energy being suppressed.

According to the resonation device 60 of the third embodiment, similarly to the resonation device 50 of the aforementioned second embodiment, it is possible to prevent the temperature of the resonator element 15 from decreasing, stably maintain the temperature of the resonator element 15, and to achieve a reduction in power consumption by virtue of the possibility of heating energy being suppressed. Further, the protruding portions 30a and 30b are disposed, and thus it is possible to suppress the inclination of the resonator element 15 in both directions with respect to the virtual line, and to further stabilize the connection posture of the resonator element 15. In addition, since the protruding portions 30a and 30b have a function of restricting the movement of the resonator element in a (vertical) direction perpendicular to the main surface of the resonator element 15, the vertical movement of the resonator element 15 is restricted when an impact is applied to the resonator element 15, thereby allowing an improvement in its impact resistance strength or the like to be achieved.

Fourth Embodiment

Figure 8:
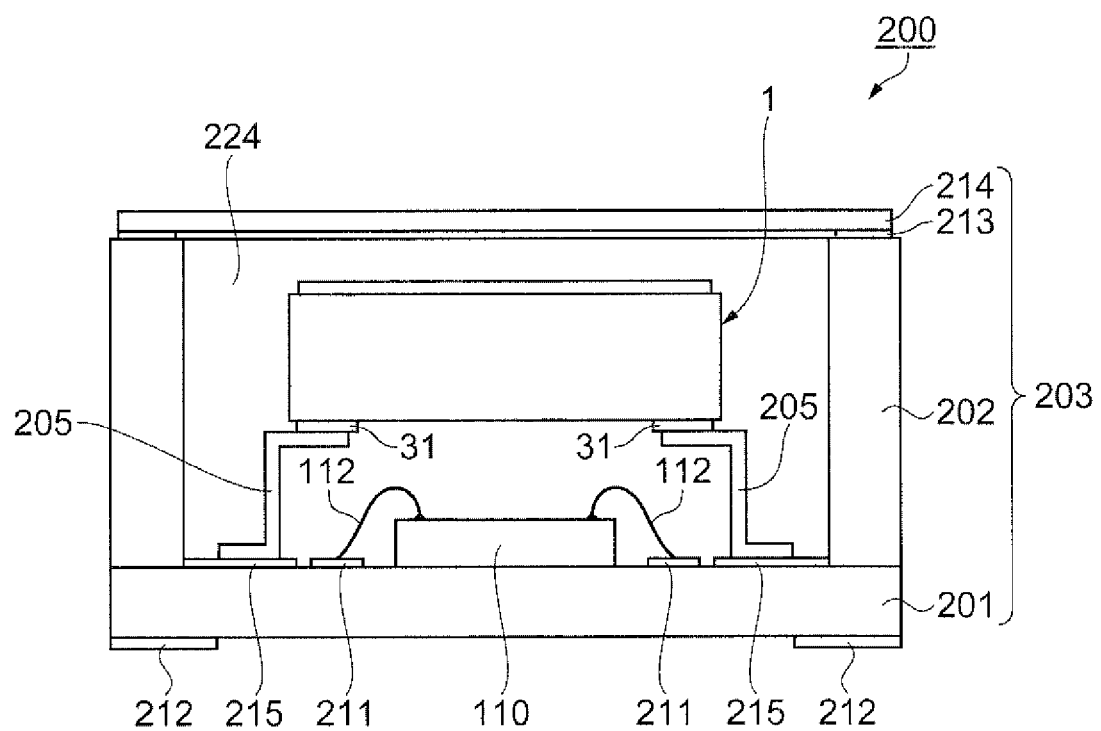
FIG. 8 is a front cross-sectional view illustrating an outline of a resonation device according to a fourth embodiment of the invention.

Next, an oscillator as a resonation device according to a fourth embodiment of the invention will be described with reference to FIG. 8. FIG. 8 is a front cross-sectional view illustrating an outline of the oscillator as a resonation device according to the fourth embodiment of the invention. Meanwhile, in the following, the same components as those of the aforementioned embodiment are denoted by the same reference numerals and signs, and thus the detailed description thereof will not be given.

Oscillator

An oscillator 200 as a resonation device according to the fourth embodiment shown in FIG. 8 includes a second package 203 having a concave portion as a storage space (internal space 224) and a lid 214 as a lid member that blocks an opening of the concave portion. A resonation device 1, a circuit element 110 that controls the resonation device 1, and the like are stored in the storage space of the second package 203. The resonation device 1 is connected to an electrode 215, provided on the bottom face of the concave portion of the second package 203, by a plurality of connection plates 205 through an external connection electrode 31. The resonator 1 and the bottom face of the concave portion of the second package 203 are separated from each other. The circuit element 110 located between the resonation device 1 and the bottom face of the concave portion of the second package 203 which are separated from each other is connected to the bottom face of the concave portion of the second package 203. Hereinafter, the resonation device 1, the second package 203, and the circuit element 110 will be sequentially described in detail.

Resonation Device

The resonation device 1 corresponds to the configuration of the above-mentioned first embodiment. Therefore, the description thereof in the present embodiment will not be given. In this configuration, although a description will be made using the resonation device 1 of the first embodiment, the resonation devices 50 and 60 of other embodiments may be used. The resonation device 1 is connected to the electrode 215 provided on the bottom face of the concave portion of the second package 203 by the plurality of connection plates 205 formed using, for example, lead frames. In this manner, the amount of heat (temperature) of the resonation device 1 controlled in a constant temperature state is not directly transferred to the package 203 by using a so-called two-step structure in which the resonation device 1 and the bottom face of the concave portion of the second package 203 are separated from each other, but is transferred through the connection plate 205. Thereby, it is possible to increase a constant-temperature property of the resonation device 1, and to perform efficient temperature control by which heating energy is suppressed.

Second Package

The second package 203 as a base substrate includes a bottom plate 201, a frame-like sidewall 202 provided in the periphery of the surface of the bottom plate 201, a seam ring 213 as a bonding material provided on the upper surface of the sidewall 202, and the lid 214 as a lid member bonded to the upper surface of the sidewall 202 through the seam ring 213. The second package 203 stores the resonation device 1, the circuit element 110 and the like.

The second package 203 as a base substrate has a concave portion (internal space 224) opened on the upper surface. An opening of the concave portion is blocked by the lid 214 as a lid member which is bonded to the sidewall 202 through the seam ring 213 as a bonding material. The opening of the concave portion of the second package 203 is blocked and thus the sealed internal space 224 is formed. The internal pressure of the sealed internal space 224 can be set to a desired atmospheric pressure. For example, the internal pressure is set to the atmospheric pressure in which nitrogen gas is filled into the internal space 224, or is set to a vacuum (state of a space filled with a gas of a pressure 1×105 Pa to 1×10-10 Pa or lower (JIS Z 8126-1: 1999) lower than the normal atmospheric pressure and thus it is possible for more stable characteristics to continue. Meanwhile, the internal space 224 of the present embodiment is assumed to be set to have the above-mentioned vacuum.

The frame-like sidewall 202 is provided in a substantially rectangular circumferential shape. In other words, the opening shape opened on the upper surface of the above concave portion is substantially rectangular. The concave portion surrounded by the plate-like bottom plate 201 and the frame-like sidewall 202 serves as the internal space (storage space) 224 that stores the resonation device 1, the circuit element 110 and the like. The seam ring 213 formed of an alloy such as, for example, Kovar is provided on the upper surface of the frame-like sidewall 202. The seam ring 213 has a function as a bonding material between the lid 214 as a lid member and the sidewall 202, and is provided in a frame shape (substantially rectangular circumferential shape) along the upper surface of the sidewall 202.

The second package 203 is formed of a material having a thermal expansion coefficient which is consistent with, or as close as possible to, the thermal expansion coefficient of the lid 214. In the present embodiment, ceramic is used. The second package 203 is formed by laminating and sintering a green sheet formed in a predetermined shape. Meanwhile, the green sheet is, for example, a material in which a kneaded material generated by dispersing ceramic powder in a predetermined solution and adding a binder is formed in a sheet shape.

An electrode 211 is formed on the bottom plate 201 constituting the bottom of the second package 203. The electrode 211 is formed by performing baking after the formation of a required shape using, for example, a conductive paste such as silver and palladium or tungsten metallization, and then plating nickel, and gold, silver or the like. The electrode 211 is connected to a pad electrode (not shown) of the circuit element 110 described later, using a metal interconnection 112. A plurality of electrodes 211 are a provided, and some of the electrodes are electrically connected to external electrodes 212 provided on the rear surface of the bottom plate 201.

Circuit Element

The circuit element 110 is disposed between the resonation device 1 and the bottom plate 201, and is connected to the bottom plate 201 by a conductive adhesive (not shown) or the like. The circuit element 110 includes, for example an oscillation circuit that oscillates the resonator element 15 of the resonation device 1, a control circuit that performs temperature control of the heat generation element 18 (see FIGS. 1A and 1B) stored in the resonation device 1, or the like. Meanwhile, the temperature control of the heat generation element 18 (see FIGS. 1A and 1B) is performed as a so-called constant temperature function of keeping the temperature of the resonator element 15 constant. A pad electrode (not shown) is provided on the active surface of the circuit element 110, and the pad electrode and the electrode 211 which is provided on the bottom plate 201 constituting the bottom of the second package 203 are connected to each other through electrical conduction by the metal interconnection (bonding wire) 112. Meanwhile, although not shown, the electrode 211 is electrically connected to each component region of the resonation device 1 and the like.

Lid as Lid Member

The lid 214 is a plate-like member, and is for blocking the opening of the concave portion opened on the upper surface of the second package 203, and bonding the periphery of the opening of the concave portion using, for example, a seam welding method or the like. Since the lid 214 of this example is plate-like, the lid is easily formed, and is excellent in shape stability. In addition, a plate material of Kovar is used in the lid 214 of this example. When sealing is performed by using Kovar in the lid 214, the seam ring 213 and the lid 214 which are formed of Kovar are molten in the same molten state, and are easily alloyed. Therefore, it is possible to perform sealing easily and reliably. Meanwhile, other plate materials may be used in the lid 214 as a substitute for Kovar, and a metal material such as, for example, 42 Alloy and stainless steel, the same material as that of the sidewall 202 of the second package 203, or the like can be used in the lid.

According to the oscillator 200 of the above-described fourth embodiment, since the resonation device 1 of the above-mentioned first embodiment is stored therein, it is possible to achieve a constant-temperature-type stable frequency output having frequency temperature characteristics improved by temperature control, and a reduction in power consumption by the suppression of heating energy. In addition, since the circuit element 110 is stored in the resonation device 1 and one second package 203, the small-sized oscillator 200 can be obtained.

Meanwhile, in the oscillator 200 of the above-mentioned fourth embodiment, although a description is made by way of a configuration example using the second package 203, a configuration using, for example, a lid body having a metal plate formed therein may be used without being limited thereto. In this configuration, the lid body has a dented concave portion including a circumferential flange on the outer circumference, and the concave portion is used as a storage space. In the configuration example of this example, configuration members such as the resonation device 1 and the circuit element 110 are stored in the concave portion of the lid body which is formed by bonding the bottom plate 201 and the flange portion of the lid body through, for example, seam welding, a bonding material such as a solder, or the like. Meanwhile, as the metal plate constituting the lid body, Kovar, a material obtained by performing plating on an iron-based metal, and the like can be used. In addition, the lid body when a bonding material such as a solder is used may have a configuration in which the flange portion provided circumferentially on the outer circumference of the lid body is not formed.

In addition, in the oscillator 200 of the above-mentioned fourth embodiment, a description is made by way of an example in which the resonation device 1 and the circuit element 110 are disposed individually, but the configuration thereof is not limited thereto. A configuration may be used in which the circuit element 110 is stored in the package 13 (see FIGS. 1A and 1B) of the resonation device 1, or a configuration may be used in which the circuit element is connected to one surface on the outer circumference of the package 13 (see FIGS. 1A and 1B) of the resonation device 1.

In addition, in the oscillator 200 of the above-mentioned fourth embodiment, a description is made by way of an example in which the resonation device 1 and the circuit element 110 are stored in the internal space 224 of the second package 203, but the configuration thereof is not limited thereto. The oscillator may be an oscillator having a configuration in which the resonation device 1 and the circuit element 110 stored in a different package are mounted and connected onto, for example, a glass epoxy substrate.

In addition, in the oscillator 200 of the above-mentioned fourth embodiment, a description is made in which the internal space 224 sealed by blocking the opening of the concave portion of the second package 203 can be set to have the atmospheric pressure in which nitrogen gas is filled therein, or set to have a vacuum, but the configuration thereof is not limited thereto. The oscillator may have a configuration exposed to the air when configuration members such as the resonation device 1 and the circuit element 110 are sealed.

Electronic Device

Next, electronic devices to which the resonation devices 1, 50, and 60, and the oscillator 200 according to each embodiment of the invention are applied will be described in detail with reference to FIGS. 9 to 11. Meanwhile, in the description, examples are shown in which the resonation device 1 including the resonator element 15 is applied.

Figure 9:
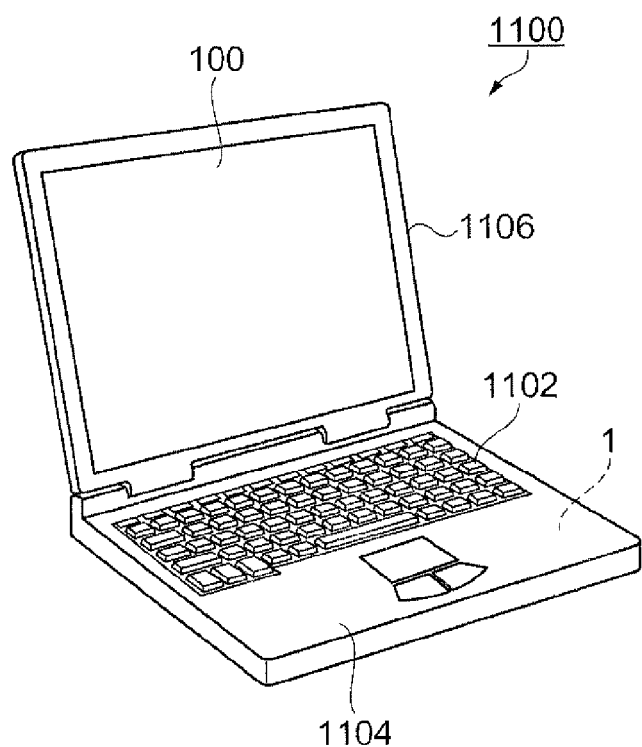
FIG. 9 is a perspective view illustrating a configuration of a mobile-type personal computer as an example of an electronic device.

FIG. 9 is a perspective view illustrating an outline of a configuration of a mobile-type (or notebook-type) personal computer as an electronic device including the resonation device 1 according to the embodiment of the invention. In the drawing, a personal computer 1100 is constituted by a main body 1104 including a keyboard 1102 and a display unit 1106 including a display portion 100, and the display unit 1106 is rotatably supported with respect to the main body 1104 through a hinge structure. Such a personal computer 1100 has the resonation device 1 built-in having a function as a signal processing timing source.

Figure 10:
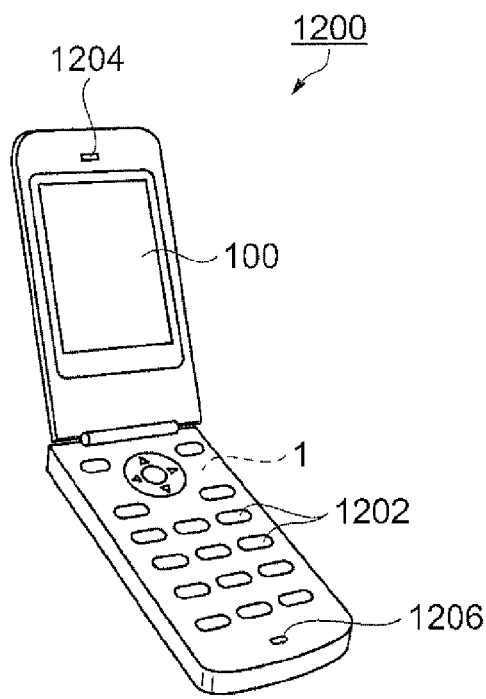
FIG. 10 is a perspective view illustrating a configuration of a cellular phone as an example of an electronic device.

FIG. 10 is a perspective view illustrating an outline of a configuration of a cellular phone (also including PHS) as an electronic device including the resonation device 1 according to the embodiment of the invention. In the drawing, a cellular phone 1200 includes a plurality of operation buttons 1202, an ear piece 1204 and a mouth piece 1206, and a display portion 100 is disposed between the operation buttons 1202 and the ear piece 1204. Such a cellular phone 1200 has the resonation device 1 built-in having a function as a signal processing timing source.

Figure 11:
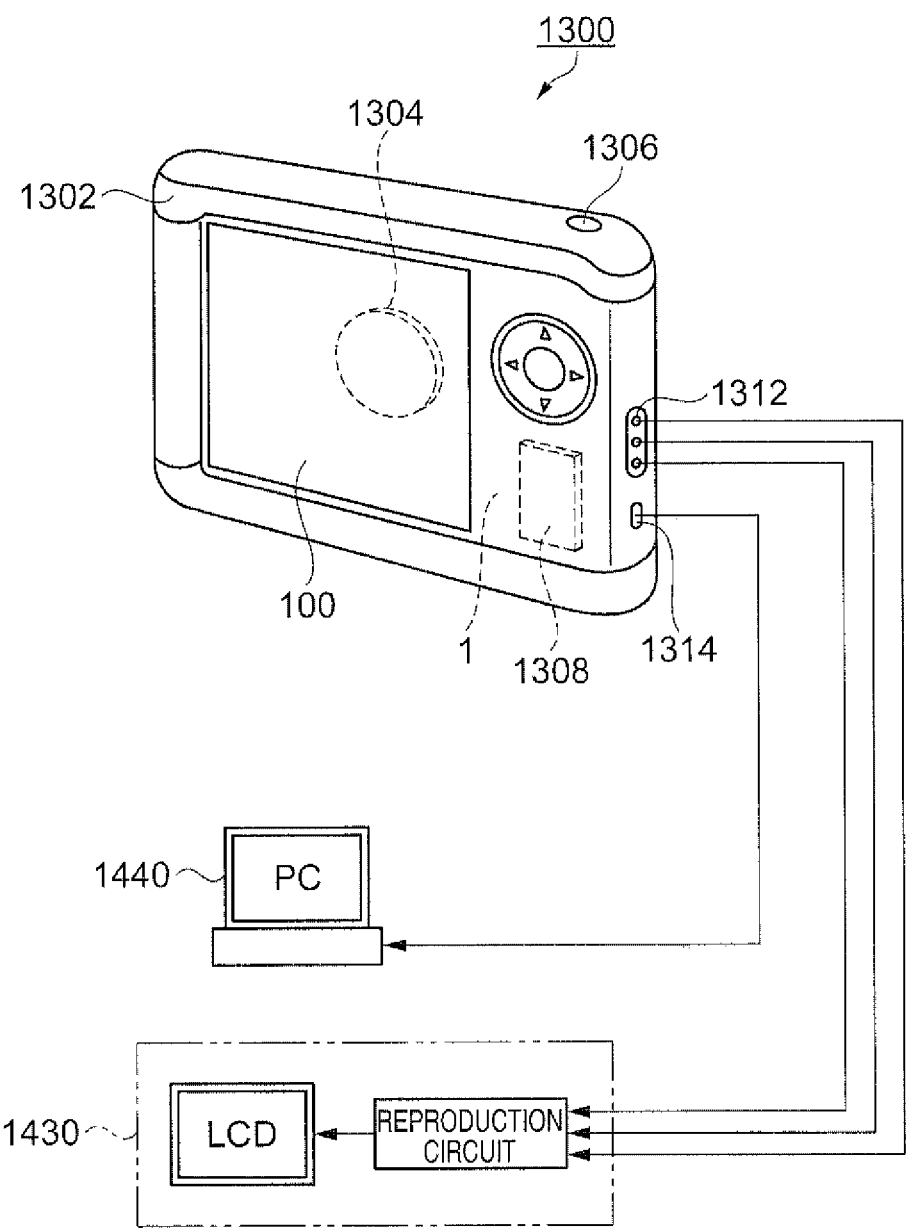
FIG. 11 is a perspective view illustrating a configuration of a digital still camera as an example of an electronic device.

FIG. 11 is a perspective view illustrating an outline of a configuration of a digital still camera as an electronic device including the resonation device 1 according to the embodiment of the invention. Meanwhile, in the drawing, the connection with an external device is also shown simply. Here, a film camera of the related art exposes a silver halide photo film through a light image of a subject, whereas a digital still camera 1300 generates an imaging signal (image signal) by photoelectrically converting a light image of a subject using an imaging device such as a CCD (Charge Coupled Device).

A display portion 100 is provided on the rear of a case (body) 1302 in the digital still camera 1300, and is configured to perform a display on the basis of an imaging signal of a CCD. The display portion 100 functions as a viewfinder for displaying a subject as an electronic image. In addition, a light-receiving unit 1304 including an optical lens (imaging optical system), a CCD and the like is provided at the front side (back side in the drawing) of the case 1302.

When a photographer confirms a subject image displayed on the display portion 100 and pushes a shutter button 1306, an imaging signal of the CCD at that point in time is transmitted and stored to and in a memory 1308. In addition, in the digital still camera 1300, a video signal output terminal 1312 and an input and output terminal 1314 for data communication are provided on the lateral side of the case 1302. As shown in the drawing, a TV monitor 1430 is connected to the video signal output terminal 1312 and a personal computer 1440 is connected to the input and output terminal 1314 for data communication, respectively as necessary. Further, the imaging signal stored in the memory 1308 is output to the TV monitor 1430 or the personal computer 1440 by a predetermined operation. Such a digital still camera 1300 has the resonation device 1 built-in having a function as a signal processing timing source.

Meanwhile, in addition to the personal computer (mobile-type personal computer) of FIG. 9, the cellular phone of FIG. 10, and the digital still camera of FIG. 11, the resonation device 1 according to the embodiment of the invention can be applied to, electronic devices such as, for example, an ink jet ejecting apparatus (for example, ink jet printer), a laptop personal computer, a television, a video camera, a video recorder, a car navigation device, a pager, an electronic notebook (also including a communication function), an electronic dictionary, an electronic calculator, an electronic game console, a word processor, a workstation, a TV phone, a security TV monitor, electronic binoculars, a POS terminal, medical instruments (for example, electronic thermometer, sphygmomanometer, blood glucose monitoring system, electrocardiogram measurement device, ultrasound diagnostic device, and electronic endoscope), a fish finder, various types of measuring apparatus, meters and gauges (for example, meters and gauges of a vehicle, an aircraft, and a vessel), and a flight simulator. Meanwhile, the use of the resonation devices 1, 50 and 60, the oscillator 200 and the like allows a constant temperature state to be maintained, and thus the resonation devices and the oscillator are suitable for an electronic device used under severe conditions of the temperature environment of a communication base station or the like.

Moving Object

Figure 12:
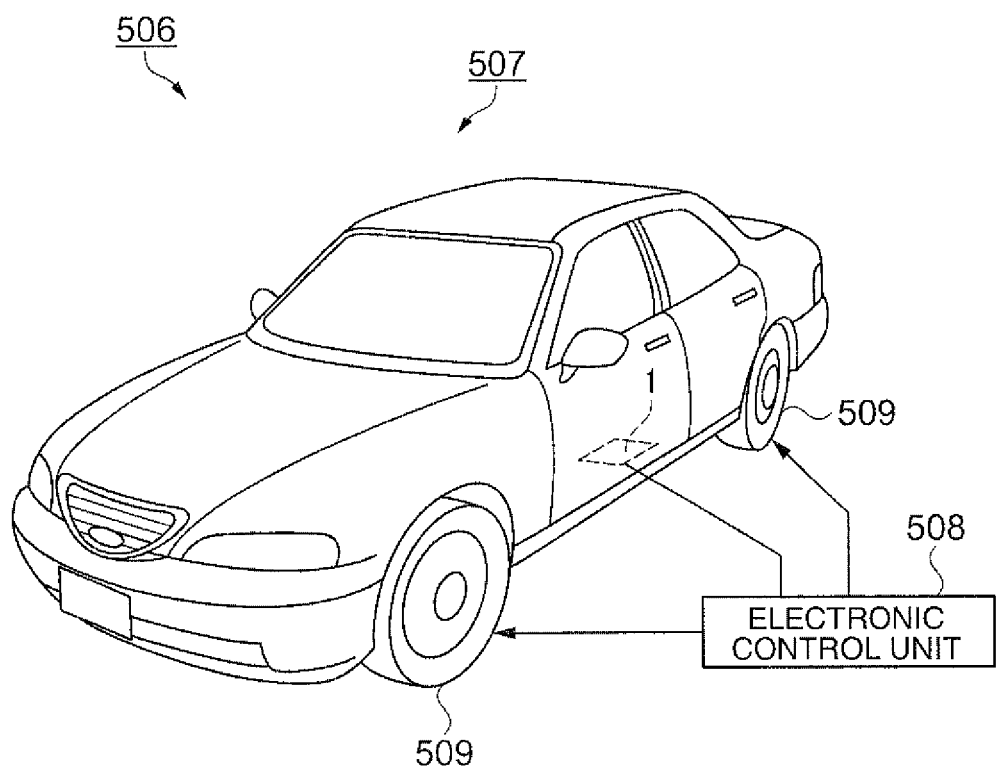
FIG. 12 is a perspective view illustrating a configuration of an automobile as an example of a moving object.

FIG. 12 is a perspective view schematically illustrating an automobile as an example of a moving object. The resonation device 1 according to the invention is mounted on an automobile 506. For example, as shown in the drawing, the automobile 506 as a moving object has the resonation device 1 built-in and has an electronic control unit 508 that controls wheels 509 or the like being mounted on a car body 507. In addition, the resonation device 1 can be applied widely to electronic control units (ECUs) such as a keyless entry, an immobilizer, a car navigation system, a car air conditioner, an antilock brake system (ABS), an air bag, a tire pressure monitoring system (TPMS), engine control, a battery monitor of a hybrid automobile or an electric automobile, and a car-body posture control system.

The entire disclosure of Japanese Patent Application No. 2013-65772, filed Mar. 27, 2013 is expressly incorporated by reference herein.

What is claimed is:

1. A resonation device comprising:
   a base substrate having a protruding portion;
   a heat generation portion; and
   a resonator element having a connection portion,
   wherein the heat generation portion is disposed in a region excluding the protruding portion of the base substrate, and the resonator element is disposed in the heat generation portion with the connection portion interposed therebetween, overlaps the protruding portion when seen in plan view, and has an area of the connection portion larger than an area of the overlapping portion between the protruding portion and the resonator element when seen in plan view, wherein the connection portion is a region having a conductive adhesive interposed between the heat generation portion and a lower side of the resonator element and extending beyond an end of the resonator element, and the heat generation portion includes a heat generating body and a thermally-conductive layer which is thermally bonded to the heat generating body and is disposed directly on the heat generating body with the resonator element connected to the thermally-conductive layer by the conductive adhesive.

2. The resonation device according to claim 1, wherein a centroid of the resonator element is disposed in a region interposed between the connection portion and the protruding portion when seen in plan view.

3. The resonation device according to claim 1, wherein at least one protruding portion is disposed in each region separated by a virtual line passing through the connection portion and the centroid of the resonator element, in a direction intersecting the virtual line when seen in plan view.

4. The resonation device according to claim 1, wherein the protruding portion includes a material having a smaller thermal conductivity than that of the base substrate.

5. The resonation device according to claim 2, wherein the protruding portion includes a material having a smaller thermal conductivity than that of the base substrate.

6. The resonation device according to claim 3, wherein the protruding portion includes a material having a smaller thermal conductivity than that of the base substrate.

7. The resonation device according to claim 1, wherein the heat generation portion that includes the heat generating body and the thermally-conductive layer which is thermally bonded to the heat generating body is disposed on the heat generating body with an intermediate layer interposed therebetween, and
the resonator element is connected to the thermally-conductive layer.

8. The resonation device according to claim 2, wherein the heat generation portion includes a heat generating body and a thermally-conductive layer which is disposed on the heat generating body with an intermediate layer interposed therebetween, and
the resonator element is connected to the thermally-conductive layer.

9. The resonation device according to claim 3, wherein the heat generation portion includes a heat generating body and a thermally-conductive layer which is disposed on the heat generating body with an intermediate layer interposed therebetween, and
the resonator element is connected to the thermally-conductive layer.

10. The resonation device according to claim 4, wherein the heat generation portion includes a heat generating body and a thermally-conductive layer which is disposed on the heat generating body with an intermediate layer interposed therebetween, and
the resonator element is connected to the thermally-conductive layer.

11. An electronic device comprising the resonation device according to claim 1.

12. An electronic device comprising the resonation device according to claim 2.

13. An electronic device comprising the resonation device according to claim 3.

14. An electronic device comprising the resonation device according to claim 4.

15. An electronic device comprising the resonation device according to claim 7.

16. A moving object comprising the resonation device according to claim 1.

17. A moving object comprising the resonation device according to claim 2.

18. A moving object comprising the resonation device according to claim 3.

19. A moving object comprising the resonation device according to claim 4.

20. A moving object comprising the resonation device according to claim 7.

* * * * *